United States Patent
Shin et al.

(10) Patent No.: US 11,810,776 B2
(45) Date of Patent: Nov. 7, 2023

(54) SEMICONDUCTOR DEVICE INCLUDING STACK STRUCTURE WITH FLAT REGION

(71) Applicant: SAMSUNG ELECTRONICS CO., LTD., Suwon-si (KR)

(72) Inventors: Seungjun Shin, Yongin-si (KR); Siwan Kim, Hwaseong-si (KR); Bonghyun Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 17/021,321

(22) Filed: Sep. 15, 2020

(65) Prior Publication Data
US 2021/0175173 A1 Jun. 10, 2021

(30) Foreign Application Priority Data
Dec. 10, 2019 (KR) .................. 10-2019-0163653

(51) Int. Cl.
*H01L 23/528* (2006.01)
*H01L 23/535* (2006.01)
(Continued)

(52) U.S. Cl.
CPC ........ *H01L 23/535* (2013.01); *H01L 23/5226* (2013.01); *H01L 23/5283* (2013.01);
(Continued)

(58) Field of Classification Search
CPC ......... H01L 27/11526; H01L 27/11573; H01L 27/11592; H01L 27/11551;
(Continued)

(56) References Cited

U.S. PATENT DOCUMENTS 8,288,816 B2 10/2012 Komori et al.
8,680,604 B2 * 3/2014 Higashi ............ H01L 27/11578
257/324
(Continued)

FOREIGN PATENT DOCUMENTS

KR 10-2010-0049971 A 5/2010
KR 10-2016-0069584 A 6/2016
KR 10-2018-0103233 A 9/2018

OTHER PUBLICATIONS

U.S. Office action dated Jan. 26, 2023 for co-pending related application U.S. Appl. No. 17/685,692, Geunwon Lim, et al.

*Primary Examiner* — Nicholas J Tobergte
*Assistant Examiner* — William Henry Anderson
(74) *Attorney, Agent, or Firm* — Lee IP Law, P.C.

(57) ABSTRACT

A semiconductor device includes a lower structure, a stack structure on the lower structure and extending from a memory cell region into a connection region, gate contact plugs on the stack structure in the connection region, and a memory vertical structure through the stack structure in the memory cell region, wherein the stack structure includes interlayer insulating layers and horizontal layers alternately stacked, wherein, in the connection region, the stack structure includes a staircase region and a flat region, wherein the staircase region includes lowered pads, wherein the flat region includes a flat pad region, a flat edge region, and a flat dummy region between the flat pad region and the flat edge region, and wherein the gate contact plugs include first gate contact plugs on the pads, flat contact plugs on the flat pad region, and a flat edge contact plug on the flat edge region.

20 Claims, 25 Drawing Sheets

(51) Int. Cl.
*H01L 23/522* (2006.01)
*H10B 41/27* (2023.01)
*H10B 41/41* (2023.01)
*H10B 43/27* (2023.01)
*H10B 43/40* (2023.01)

(52) U.S. Cl.
CPC ............. *H10B 41/27* (2023.02); *H10B 41/41* (2023.02); *H10B 43/27* (2023.02); *H10B 43/40* (2023.02)

(58) Field of Classification Search
CPC ......... H01L 27/11578; H01L 27/11597; H01L 21/76816; H01L 21/76877; H01L 21/76895; H10B 41/40; H10B 43/40; H10B 51/40; H10B 41/20; H10B 43/20; H10B 51/20
See application file for complete search history.

(56) References Cited

U.S. PATENT DOCUMENTS

| | | | |
|---|---|---|---|
| 8,933,502 B2 | 1/2015 | Higashitani et al. | |
| 9,006,884 B2 | 4/2015 | Lee et al. | |
| 9,653,562 B2 | 5/2017 | Kim et al. | |
| 9,721,663 B1 | 8/2017 | Ogawa et al. | |
| 9,985,041 B2 | 5/2018 | Yun et al. | |
| 10,186,452 B2* | 1/2019 | Chang | H10B 41/27 |
| 10,229,929 B2 | 3/2019 | Kim et al. | |
| 10,276,585 B2 | 4/2019 | Utsumi | |
| 11,081,443 B1* | 8/2021 | Mizutani | H01L 27/11556 |
| 11,264,387 B2* | 3/2022 | Matsumoto | H01L 27/11524 |
| 11,271,003 B2* | 3/2022 | Lim | G11C 5/025 |
| 2010/0109093 A1 | 5/2010 | Park | |
| 2015/0255385 A1 | 9/2015 | Lee et al. | |
| 2016/0163386 A1 | 6/2016 | Hwang et al. | |
| 2017/0179154 A1 | 6/2017 | Furihata et al. | |
| 2018/0053686 A1 | 2/2018 | Hyun et al. | |
| 2018/0102281 A1* | 4/2018 | Yang | H01L 21/76816 |
| 2018/0261618 A1 | 9/2018 | Lee et al. | |
| 2019/0019807 A1 | 1/2019 | Gu et al. | |
| 2019/0043880 A1 | 2/2019 | Lee et al. | |
| 2019/0081070 A1 | 3/2019 | Lu et al. | |
| 2019/0214404 A1 | 7/2019 | Ahn et al. | |
| 2019/0221574 A1 | 7/2019 | Shimabukuro et al. | |
| 2021/0020656 A1 | 1/2021 | Kim et al. | |
| 2021/0057442 A1* | 2/2021 | Zhang | H01L 27/11556 |
| 2021/0151455 A1* | 5/2021 | Xu | H01L 23/535 |
| 2021/0175173 A1 | 6/2021 | Shin et al. | |

* cited by examiner

SEMICONDUCTOR DEVICE INCLUDING STACK STRUCTURE WITH FLAT REGION

CROSS-REFERENCE TO RELATED APPLICATION

Korean Patent Application No. 10-2019-0163653, filed on Dec. 10, 2019, in the Korean Intellectual Property Office, and entitled: "Semiconductor Device," is incorporated by reference herein in its entirety.

BACKGROUND

1. Field

Example embodiments relate to a semiconductor device, and more particularly, to a semiconductor device including a stack structure having a flat region in a connection region adjacent to a memory cell array region.

2. Description of the Related Art

A semiconductor device may include gate electrodes stacked from a surface of a semiconductor substrate in a vertical direction. To implement high integration density of such a semiconductor device, the number of stacked gate electrodes may be increased.

SUMMARY

According to an example embodiment, a semiconductor device includes a lower structure, a stack structure disposed in a memory cell array region on the lower structure and extending from the memory cell array region into a connection region, an upper insulating layer on the stack structure, gate contact plugs in the connection region, and a memory vertical structure penetrating through the stack structure in the memory cell array region, wherein the stack structure includes a plurality of interlayer insulating layers and a plurality of horizontal layers, wherein the plurality of interlayer insulating layers and the plurality of horizontal layers are alternately stacked in the memory cell array region on the lower structure, and extends into the connection region on the lower structure adjacent to the memory cell array region, wherein, in the connection region, a first cross-sectional structure of the stack structure includes a first gate staircase region and a first gate flat region adjacent to the first gate staircase region, wherein the first gate staircase region includes first gate pads lowering in a first horizontal direction by a first height therebetween, wherein the first horizontal direction is directed to the connection region in the memory cell array region, wherein the first gate flat region includes a first gate flat pad region, a first gate flat edge region, and a first gate flat dummy region disposed between the first gate flat pad region and the first gate flat edge region, and wherein the gate contact plugs include a plurality of first gate contact plugs in contact with the first gate pads on the first gate pads, a plurality of flat contact plugs in contact with the first gate flat pad region on the first gate flat pad region, and an edge flat contact plug in contact with the first gate flat edge region on the first gate flat edge region.

According to an example embodiment, a semiconductor device includes a lower structure, a stack structure disposed in a memory cell array region on the lower structure and extending from the memory cell array region into a connection region, gate contact plugs on the stack structure in the connection region, and a memory vertical structure penetrating through the stack structure in the memory cell array region, wherein the stack structure includes a plurality of interlayer insulating layers and a plurality of horizontal layers alternately stacked, wherein, in the connection region, the stack structure includes a staircase region and a flat region adjacent to the staircase region, wherein the staircase region includes pads lowered in a first horizontal direction, wherein the flat region includes a flat pad region, a flat edge region, and a flat dummy region disposed between the flat pad region and the flat edge region, and wherein the gate contact plugs include first gate contact plugs on the pads, a plurality of flat contact plugs on the flat pad region, and a flat edge contact plug on the flat edge region.

According to an example embodiment, a semiconductor device includes a lower structure, a stack structure disposed in a memory cell array region on the lower structure and extending from the memory cell array region into a connection region, gate contact plugs on the stack structure, and a memory vertical structure penetrating through the stack structure in the memory cell array region, wherein the stack structure includes a lower stack structure and an upper stack structure on the lower stack structure, wherein the lower stack structure includes a plurality of lower horizontal layers stacked and spaced apart from each other in a vertical direction, wherein the vertical direction is perpendicular to an upper surface of the lower structure, wherein the upper stack structure includes a plurality of upper horizontal layers stacked and spaced apart from each other in the vertical direction, wherein the plurality of upper horizontal layers include a first staircase region including first pads lowered in the connection region by a first height therebetween, wherein the lower horizontal layers include a second staircase region including second pads lowered by a second height smaller than the first height, wherein the upper stack structure includes a first flat region adjacent to the first staircase region, wherein the lower stack structure includes a second flat region adjacent to the second staircase region, wherein each of the first pads has a first length, wherein the first flat region includes a flat pad region having a second length greater than the first length in a first horizontal direction, a flat edge region having a third length greater than the first length in the first horizontal direction, and a flat dummy region disposed between the flat pad region and the flat edge region, wherein the a fourth length of the flat dummy region in the first horizontal direction is greater than each of the second length and the third length, wherein the second flat region has a length greater than the first length in the first horizontal direction, and wherein the gate contact plugs include a plurality of first gate contact plugs on first and second pads, a second gate contact plug and a dummy contact plug spaced apart from each other on the flat pad region, and a flat edge contact plug on the flat edge region.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, embodiments will be described as follows with reference to the accompanying drawings.

Figure 1A:
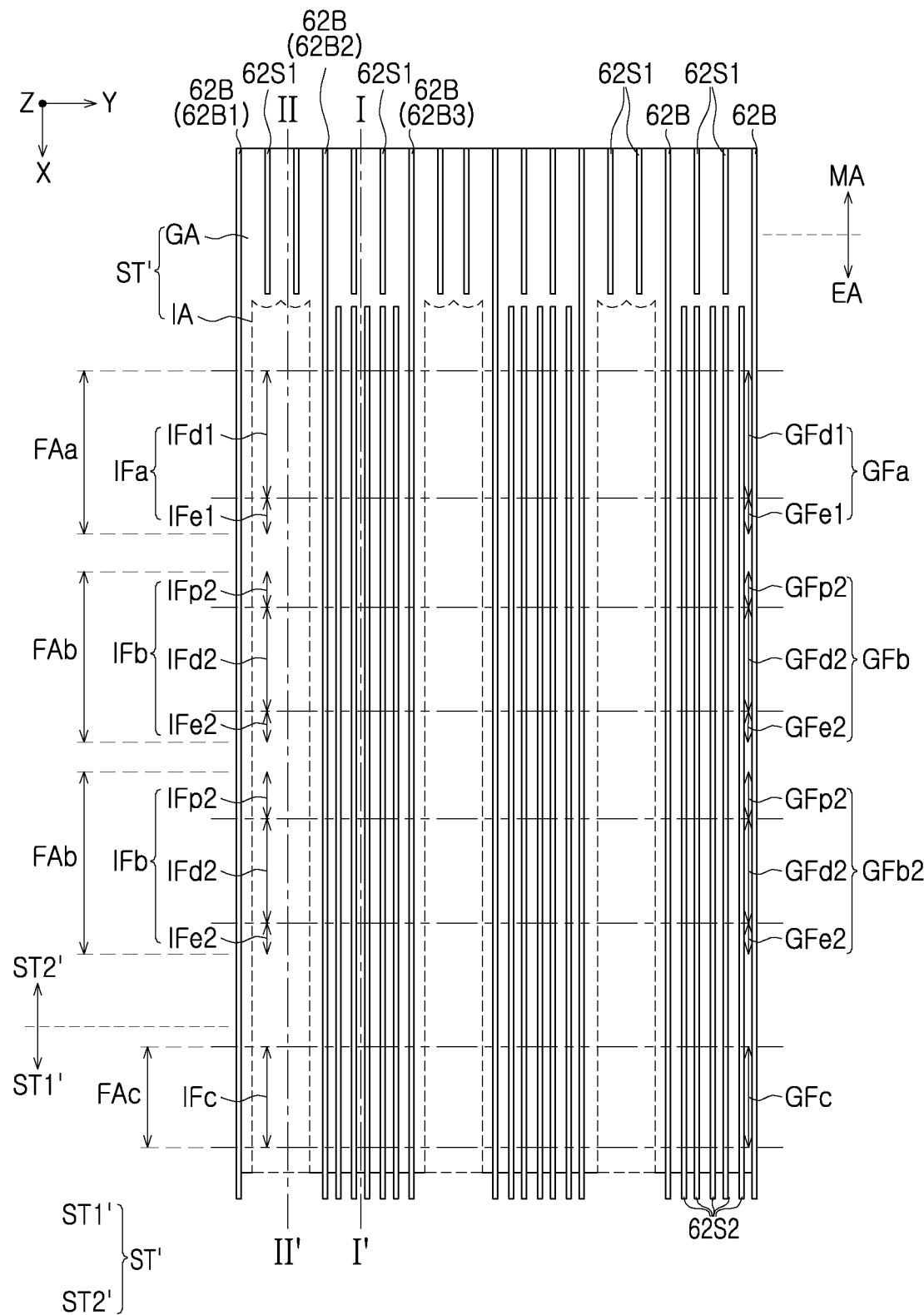
FIGS. 1A to 5B are diagrams illustrating a semiconductor device according to an example embodiment.
Figure 1B:
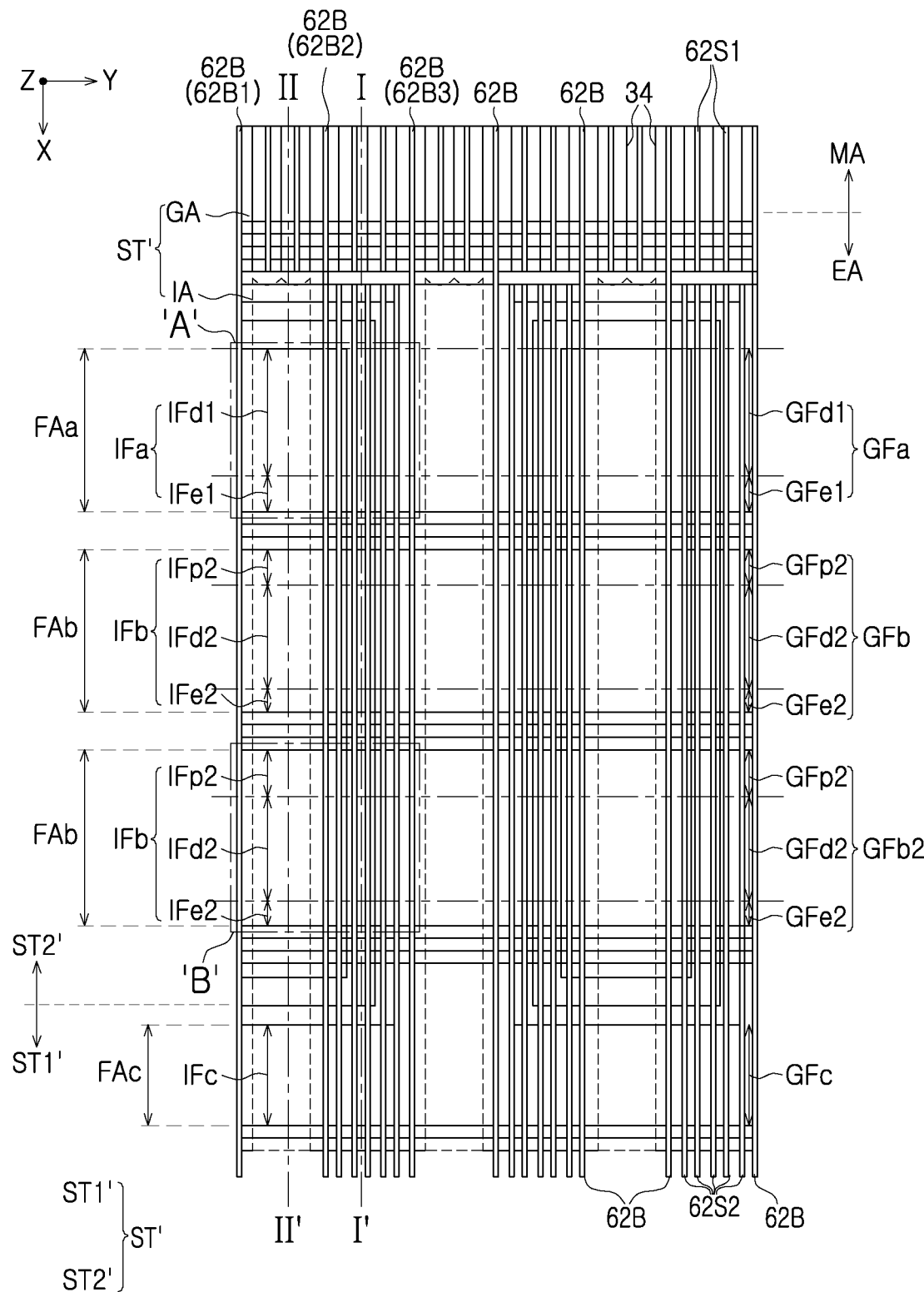

In the description below, a planar structure of a semiconductor device will be described with reference to FIGS. 1A and 1B. FIGS. 1A and 1B are plan diagrams illustrating a semiconductor device according to an example embodiment, and FIG. 1A illustrates a plan diagram illustrating a portion of the elements illustrated in FIG. 1B.

Referring to FIGS. 1A and 1B, a memory cell array region MA and a connection region EA adjacent to the memory cell array region MA, e.g., along the first horizontal direction X, may be provided. A stack structure ST' may be disposed in the memory cell array region MA and may extend into the connection region EA. The stack structure ST' may include a gate region GA and an insulating region IA. An internal region indicated by a dashed line in FIGS. 1A and 1B refers to the insulating region IA, e.g., a portion of the dashed line denoted as "IA" in FIGS. 1A and 1B and facing the gate region GA may be understood as a boundary with the gate region GA. The insulating region IA may be disposed in the connection region EA. The insulating region IA may be spaced apart from the memory cell array region MA.

A plurality of separation structures 62B, 62S1, and 62S2 may be disposed. The plurality of separation structures 62B, 62S1, and 62S2 may include block separation structures 62B, first auxiliary separation structures 62S1 and second auxiliary separation structures 62S2. The plurality of separation structures 62B, 62S1, and 62S2 may be formed of the same material.

For example, each of the plurality of separation structures 62B, 62S1, and 62S2 may be formed of an insulating material, e.g., silicon oxide, or the like. In another example embodiment, each of the plurality of separation structures 62B, 62S1, and 62S2 may be configured to include a conductive material and an insulating material between the conductive material and the stack structure ST'.

The block separation structures 62B may, e.g., continuously, cross the memory cell array region MA and the connection region EA in the first horizontal direction X, and may separate, e.g., each of, the memory cell array region MA and the connection region EA in a second horizontal direction Y perpendicular to the first horizontal direction X.

The first auxiliary separation structures 62S1 may cross the memory cell array region MA and may, e.g., partially, extend into the connection region EA. The second auxiliary separation structures 62S2 may be spaced apart from the memory cell array region MA, and may be disposed in the connection region EA. The first and second auxiliary separation structures 62S1 and 62S2 may be disposed between, e.g., adjacent ones of, the block separation structures 62B.

The block separation structures 62B may include a first block separation structure 62B1, a second block separation structure 62B2, and a third block separation structure 62B3 arranged in order, e.g., sequentially, in the second horizontal direction Y.

The first auxiliary separation structures 62S1 may be disposed between the first block separation structure 62B1 and the second block separation structure 62B2 and may be disposed between the second block separation structure 62B2 and the third block separation structure 62B3. In an example embodiment, the second auxiliary separation structures 62S2 may not be disposed between the first block separation structure 62B1 and the second block separation structure 62B2, and may be disposed between the second block separation structure 62B2 and the third block separation structure 62B3.

In an example embodiment, an insulating separation pattern 34 (in FIG. 1B) may be disposed between separation structures of the second block separation structures 62B2 and the first auxiliary separation structures 62S1, the separation structures adjacent to each other in the second horizontal direction Y. The insulating separation pattern 34 (in FIG. 1B) may cross the memory cell array region MA and may extend into the connection region EA.

The insulating region IA may be disposed, e.g., only, in the connection region EA, e.g., among the memory cell array region MA and the connection region EA. In the stack structure ST', a region other than the insulating region IA may be defined as the gate region GA. For example, in the connection region EA, a region other that the insulating region IA (e.g., which is indicated with dashed frames in FIGS. 1A and 1B) is the gate region GA, e.g., portions of the connections region EA between adjacent dashed frames are parts of the gate region GA.

In an example embodiment, the insulating region IA may be disposed between the first block separation structure 62B1 and the second block separation structure 62B2, and may not be disposed between the second block separation structure 62B2 and the third block separation structure 62B3. The insulating region IA may be spaced apart from the first auxiliary separation structures 62S1 and the insulating separation pattern 34 (in FIG. 1B). In an example embodiment, each of the block separation structures 62B may be disposed between the insulating region IA and the second auxiliary separation structures 62S2 adjacent to each other in the second horizontal direction Y.

In the connection region EA, the stack structure ST' may have a staircase structure. In the connection region EA, the stack structure ST' may include a plurality of flat regions FAa, FAb, and FAc. For example, the stack structure ST' may include an upper flat region FAa, one or a plurality of intermediate flat regions FAb, and a lower flat region FAc disposed in order, e.g., sequentially, in a direction oriented away from the memory cell array region MA along the first horizontal direction X.

Figure 1C:
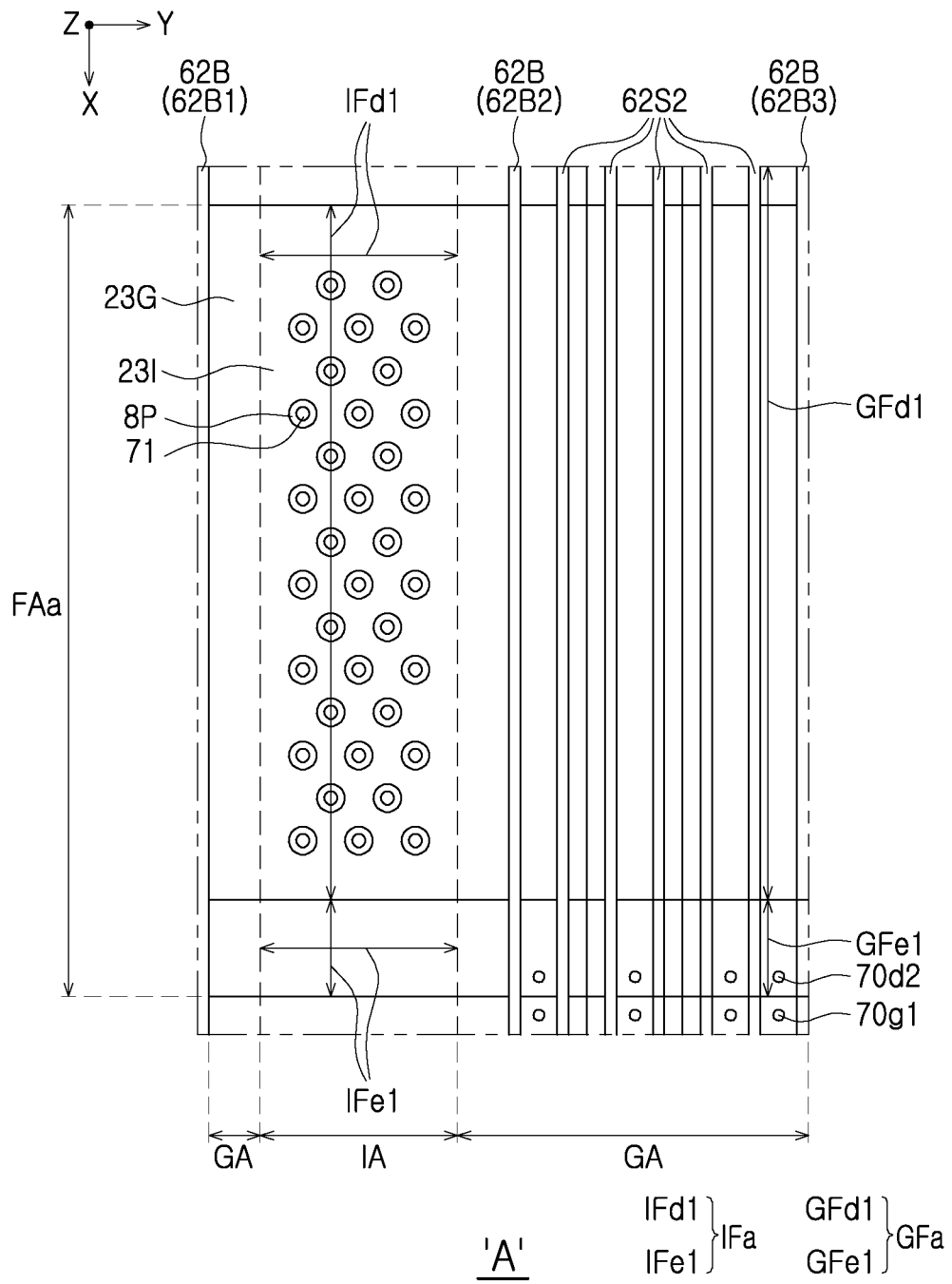
Figure 1D:
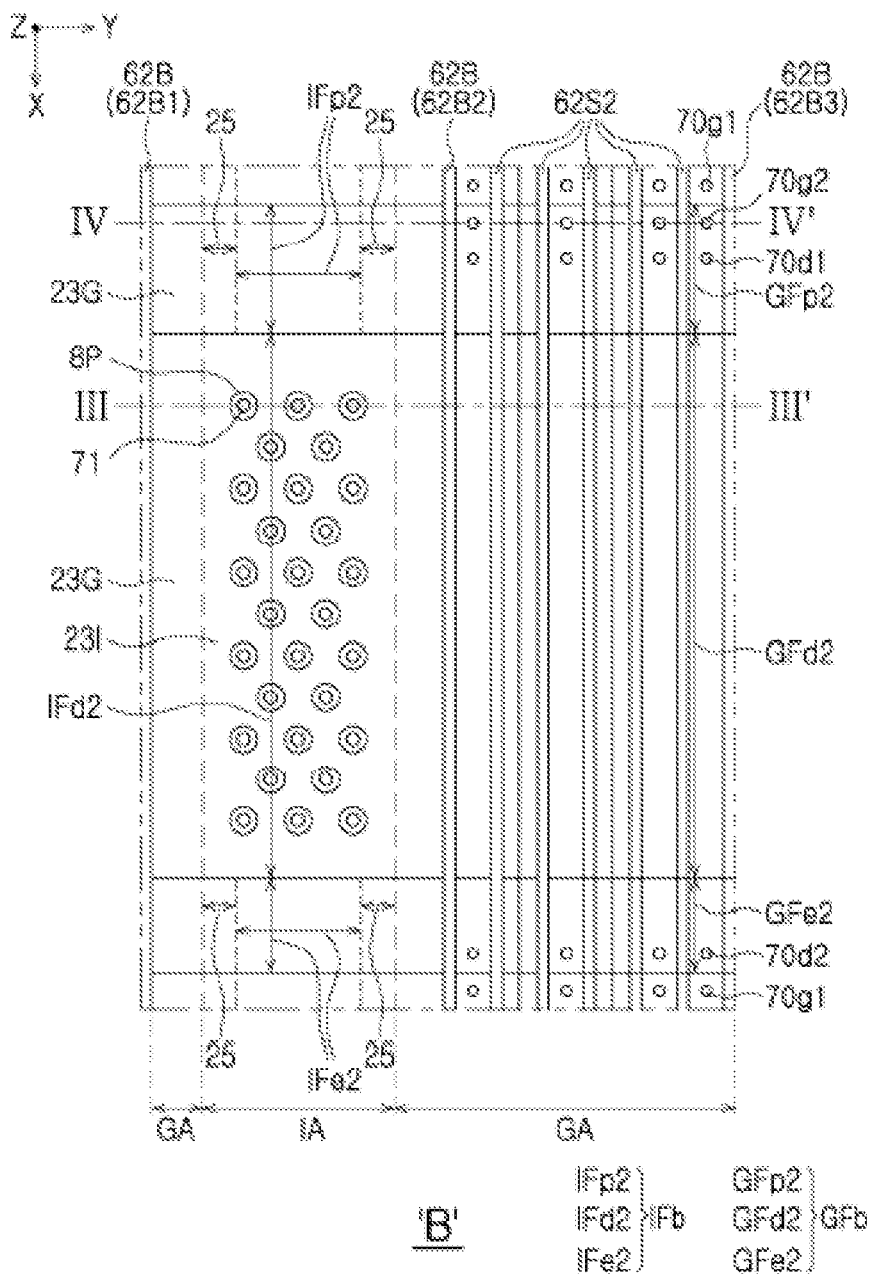
Figure 2A:
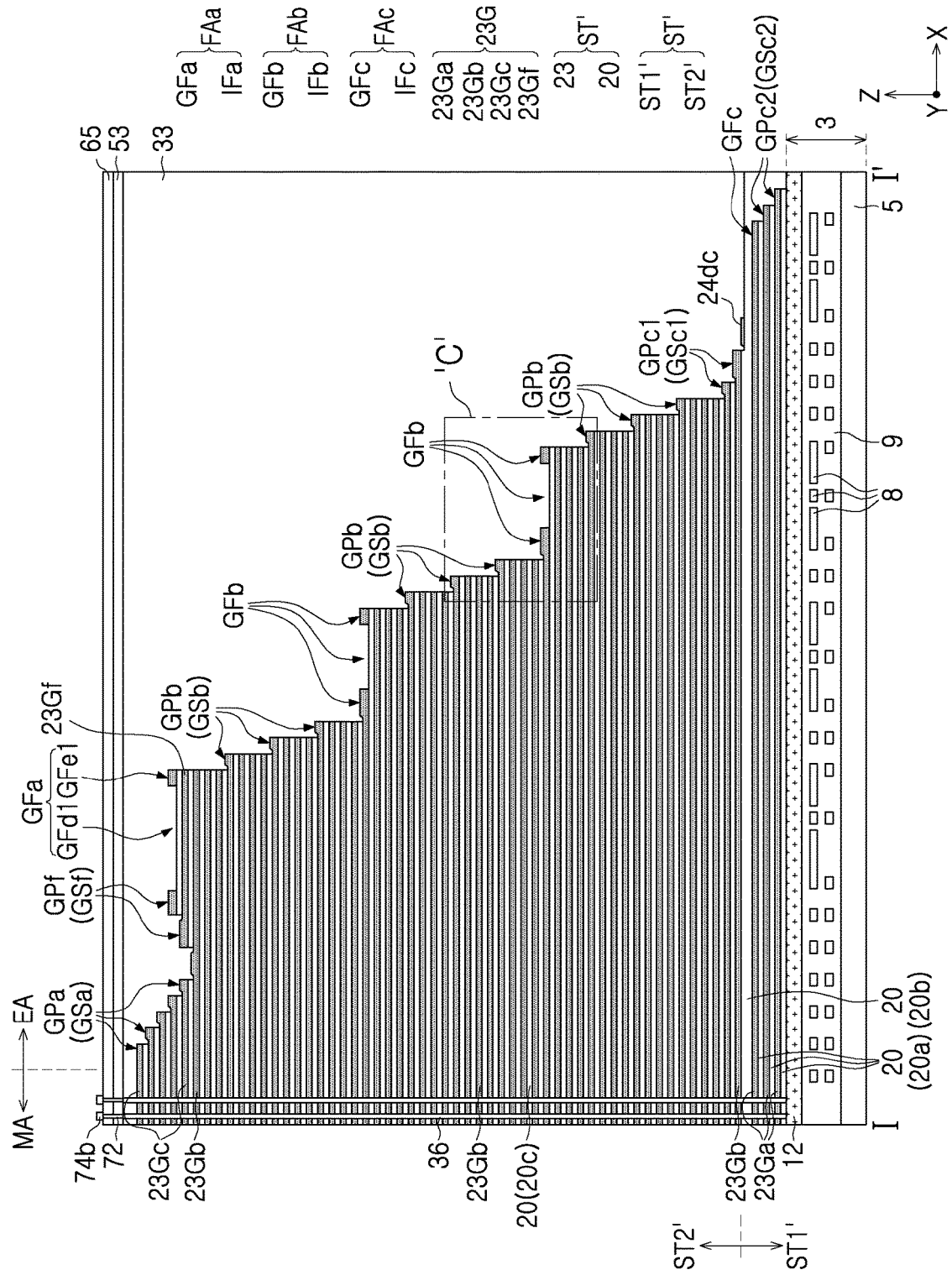
Figure 2B:
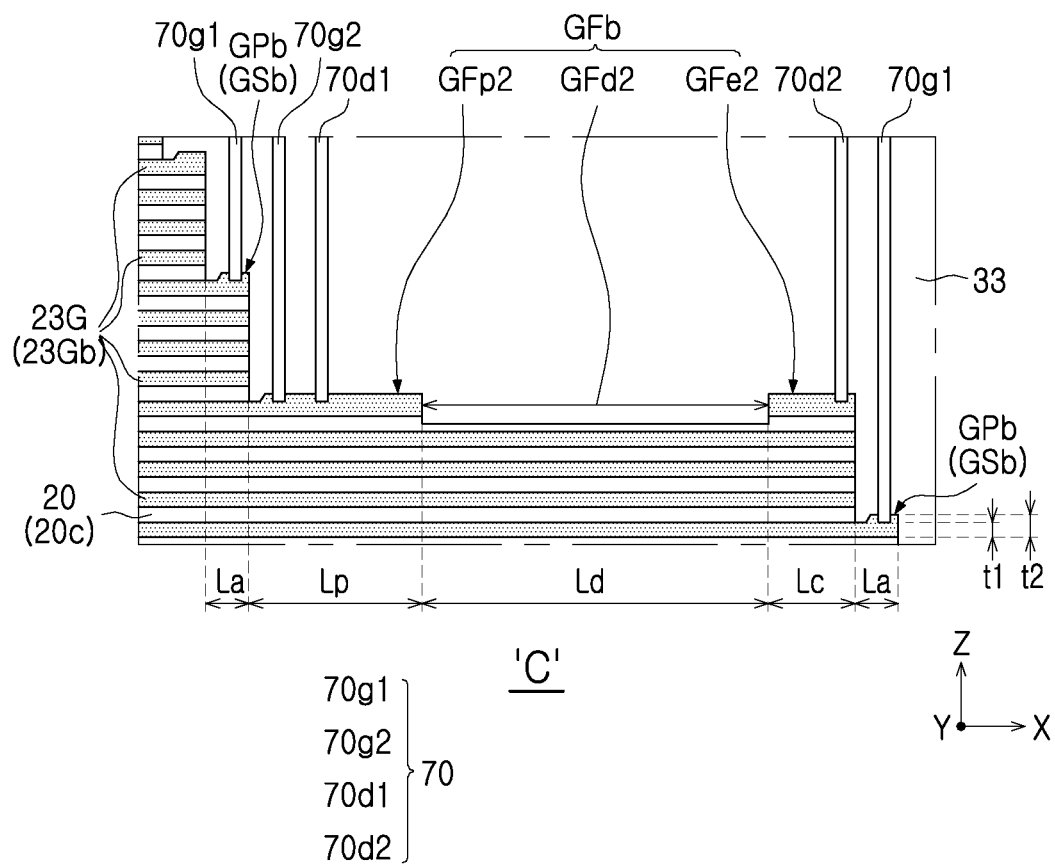
Figure 3A:
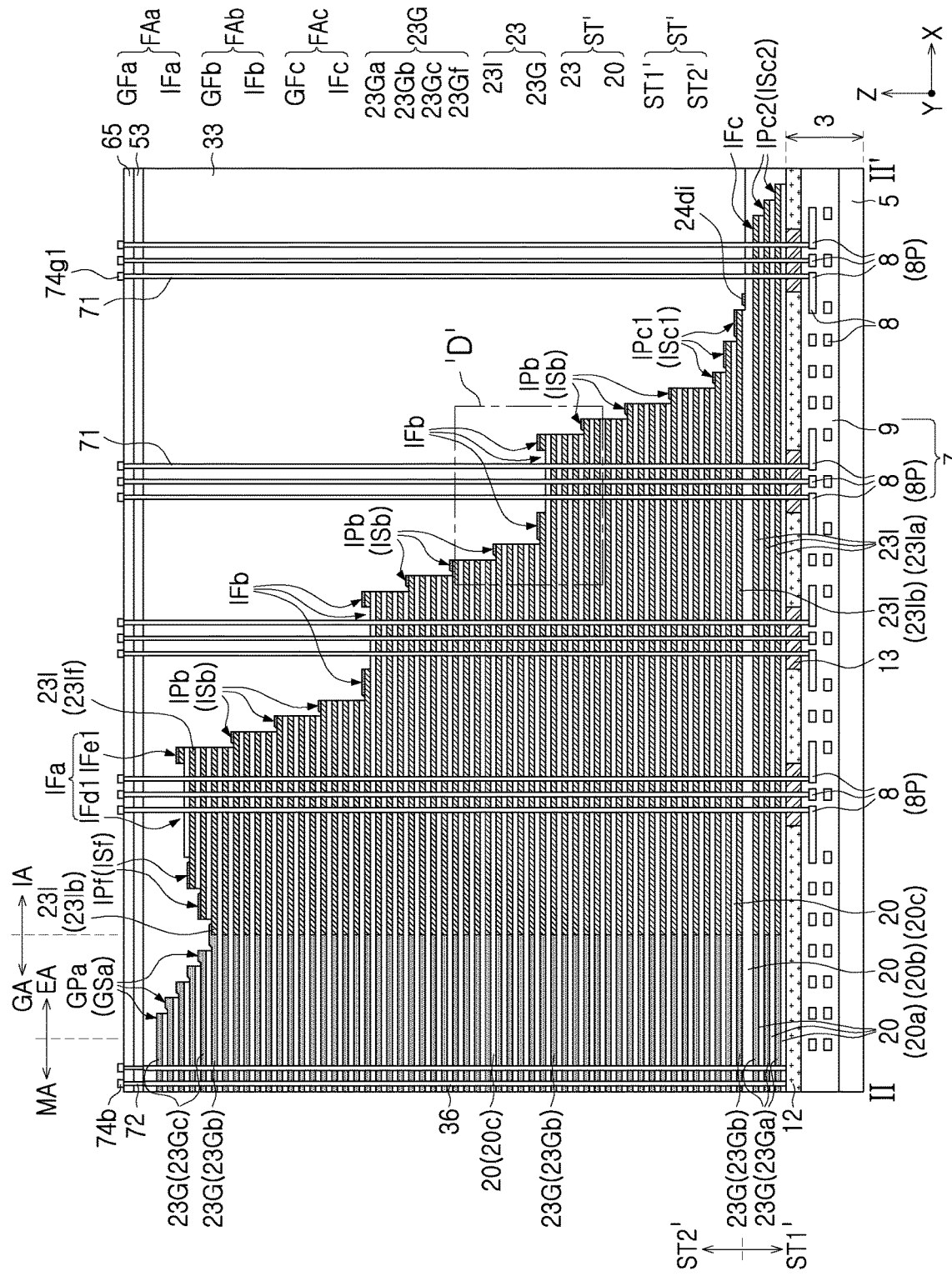
Figure 3B:
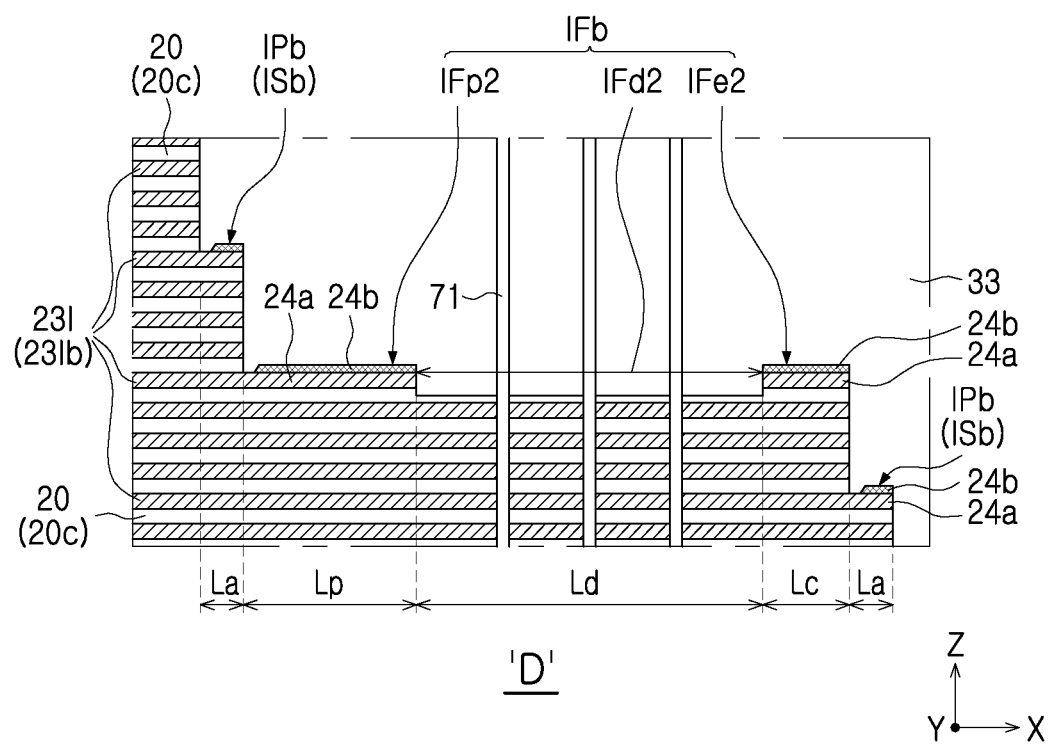

In the description below, a semiconductor device will be described with reference to FIGS. 1C, 1D, and 2A to 3B along with FIGS. 1A and 1B. FIG. 1C is an enlarged plan diagram of portion "A" in FIG. 1B, FIG. 1D is an enlarged plan diagram of portion "B" in FIG. 1B, FIG. 2A is a cross-sectional diagram along line I-I' in FIG. 1B, FIG. 2B is an enlarged diagram of portion "C" in FIG. 2A, FIG. 3A is a cross-sectional diagram along line II-IF in FIG. 1B, and FIG. 3B is an enlarged diagram of portion "D" illustrated in FIG. 3A.

Referring to FIGS. 1A to 3B, an integrated circuit region 7 may be disposed on a lower substrate 5. The lower substrate 5 may be configured as a semiconductor substrate (e.g., a single crystalline silicon substrate). The integrated circuit region 7 may include circuit wirings 8 and a lower insulating layer 9 covering the circuit wirings 8. The circuit wirings 8 may include peripheral contact pads 8P. An upper substrate 12 may be disposed on the integrated circuit region 7. The upper substrate 12 may include, e.g., polysilicon. A gap-fill insulating layer 13 penetrating through the upper substrate 12 may be disposed. In an example embodiment, the gap-fill insulating layer 13 may be formed of an insulating material, e.g., silicon oxide. A lower structure 3 may include the lower substrate 5, the integrated circuit region 7, the upper substrate 12 and the gap-fill insulating layer 13.

For example, a plurality of the gap-fill insulating layers 13 may be disposed under the insulating region IA disposed between a pair of block separation structures 62B adjacent to each other. In another example, the gap-fill insulating layer 13 may be configured to have a line shape extending in the first horizontal direction X under the insulating region IA disposed between the pair of block separation structures 62B adjacent to each other.

The memory cell array region MA and the connection region EA may be defined on the upper substrate 12. The stack structure ST' may be disposed in the memory cell array region MA on the upper substrate 12, and may extend into the connection region EA on the upper substrate 12. The first horizontal direction X may be in parallel to an upper surface of the upper substrate 12.

A first upper insulating layer 33 may be disposed on the stack structure ST'. A memory vertical structure 36 penetrating through the first upper insulating layer 33 and the stack structure ST' may be disposed. A second upper insulating layer 53 may be disposed on the first upper insulating layer 33. The plurality of separation structures 62B, 62S1, and 62S2 may penetrate through the second upper insulating layer 53, the first upper insulating layer 33, and the stack structure ST'. A third upper insulating layer 65 may be disposed on the second upper insulating layer 53. A bit line contact plug 72 penetrating through the second and third upper insulating layers 53 and 65 and electrically connected to the memory vertical structure 36 may be disposed. A bit line 74b may be disposed on the bit line contact plug 72. The first to third upper insulating layers 33, 53, and 65 may be formed of an insulating material, e.g., silicon oxide, or the like.

The stack structure ST' may include interlayer insulating layers 20 and horizontal layers 23 alternately stacked. The interlayer insulating layers 20 and the horizontal layers 23 may be alternately stacked in a vertical direction Z in the memory cell array region MA, and may extend from the memory cell array region MA into the connection region EA. The vertical direction Z may be perpendicular to an upper surface of the lower structure 3. The horizontal layers 23 may include pad regions formed in a staircase shape in the connection region EA.

The stack structure ST' may include a lower stack structure ST1' and an upper stack structure ST2' disposed on the lower stack structure ST1'.

The lower stack structure ST1' may include a first interlayer insulating layer 20a and lower horizontal layers 23Ga and 23Ia alternately stacked. A lowermost layer of the first interlayer insulating layer 20a and the lower horizontal layers 23Ga and 23Ia may be a lower interlayer insulating layer, and an uppermost layer may be a lower horizontal layer. The lower stack structure ST1' may further include a second interlayer insulating layer 20b covering the first interlayer insulating layer 20a and the lower horizontal layers 23Ga and 23Ia.

The upper stack structure ST2' may include a plurality of horizontal layers 23G and 23I stacked and spaced apart from each other in the vertical direction Z. The upper stack structure ST2' may further include a plurality of third interlayer insulating layers 20c alternately stacked with the plurality of horizontal layers 23G and 23I. The interlayer insulating layers 20 may include first to third interlayer insulating layers 20a, 20b, and 20c. The interlayer insulating layers 20 may be formed of an insulating material, e.g., silicon oxide.

The plurality of horizontal layers 23G and 23I may include a plurality of intermediate horizontal layers 23Gb and 23Ib, upper horizontal layers 23Gc disposed on the plurality of intermediate horizontal layers 23Gb and 23Ib, and floating horizontal layers 23Gf and 23If disposed on the plurality of intermediate horizontal layers 23Gb and 23Ib. The horizontal layers 23 may include the lower horizontal layers 23Ga and 23Ia, the intermediate horizontal layers 23Gb and 23Ib, the upper horizontal layers 23Gc, and the floating horizontal layers 23Gf and 23If.

The intermediate horizontal layers 23Gb and 23Ib may be stacked and spaced apart from each other in the vertical direction Z in the memory cell array region MA and may extend into the connection region EA. The upper horizontal layers 23Gc may be stacked and spaced apart from each other in the vertical direction Z in the memory cell array region MA and may extend into the connection region EA.

Each of the upper horizontal layers 23Gc may have a length shorter than a length of each of the intermediate horizontal layers 23Gb and 23Ib in the first horizontal direction X. The floating horizontal layers 23Gf and 23If may be stacked and spaced apart from each other in the vertical direction Z in the connection region EA. The floating horizontal layers 23Gf and 23If may face the upper horizontal layers 23Gc, e.g., each of the floating horizontal layers 23Gf and 23If may be at a same level as and face a corresponding one of the upper horizontal layers 23Gc with a predetermined distance therebetween.

In the stack structure ST', the horizontal layers 23 disposed in the gate region GA may be gate horizontal layers 23G, and the horizontal layers 23 disposed in the insulating region IA may be insulating horizontal layers 23I. Accordingly, the gate horizontal layers 23G and the insulating horizontal layers 23I may be in contact with each other at a boundary between the gate region GA and the insulating region IA disposed in the connection region EA, e.g., each of the insulating horizontal layers 23I may directly contact a corresponding one of the gate horizontal layers 23G at the boundary between the gate region GA and the insulating region IA and extend therefrom along the first horizontal direction X in the insulating region IA. For example, referring to FIGS. 1B, 2A, and 3A, the insulating horizontal layers 23I may directly extend from corresponding ones of the gate horizontal layers 23G in both the lower and upper stack structure ST1' and ST'2 only at the insulating region IA of the connection region EA, e.g., the gate horizontal layers 23G may extend in the connection region EA in parallel to the insulating horizontal layers 23I between adjacent insulating regions IA (e.g., between the dashed regions of FIG. 1A).

Lower horizontal layers of the horizontal layers 23 disposed in the gate region GA may be lower gate horizontal layers 23Ga, and lower horizontal layers of the horizontal layers 23 disposed in the insulating region IA may be lower insulating horizontal layers 23Ia. Similarly, intermediate horizontal layers of the horizontal layers 23 disposed in the gate region GA may be intermediate gate horizontal layers 23Gb, and intermediate horizontal layers of the horizontal layers 23 disposed in the insulating region IA may be intermediate insulating horizontal layers 23Ib. The upper horizontal layers 23Gc may be disposed in the gate region GA, and may be upper gate horizontal layers. In the description below, the upper horizontal layers 23Gc are referred to as upper gate horizontal layers. Floating horizontal layers of the horizontal layers 23 may include floating gate horizontal layers 23Gf disposed in the gate region GA (FIG. 2A), and floating insulating horizontal layers 23If disposed in the insulating region IA (FIG. 3A).

The gate horizontal layers 23 may include the gate horizontal layers 23G and the insulating horizontal layers 23I. The gate horizontal layers 23G may include the lower gate horizontal layers 23Ga, the intermediate gate horizontal layers 23Gb, the upper gate horizontal layers 23Gc, and the floating gate horizontal layers 23Gf. The insulating horizontal layers 23I (in FIG. 3A) may include the lower insulating horizontal layers 23Ia, the intermediate insulating horizontal layers 23Ib, and the floating gate horizontal layers 23Gf.

In an example embodiment, the insulating horizontal layers 23I may be formed of an insulating material having etch selectivity with respect to the interlayer insulating layers 20, e.g., formed of silicon nitride. In an example embodiment, the gate horizontal layers 23G may include a conductive material.

Referring to FIG. 2A, the gate horizontal layers 23G may include pad regions formed in a staircase shape in the connection region EA.

The intermediate gate horizontal layers 23Gb may include intermediate gate pads GPb lowering in the first horizontal direction X with a difference of a first length therebetween and first lower gate pads GPc1 lowering in the first horizontal direction X with a difference of a second length therebetween. The second length may be smaller than the first length.

The upper gate horizontal layers 23Gc may include upper gate pads GPc lowering in order with a difference of the second length in the first horizontal direction X, and floating gate horizontal layers 23Gf may include floating gate pads GPf lowering in order with a difference of the second length in the first horizontal direction X. The lower gate horizontal layers 23Ga may include second lower gate pads GPc2 lowering in order with a difference of the second length in the first horizontal direction X. Accordingly, the first length between the intermediate gate pads GPb adjacent to each other may be greater than the second length between the second lower gate pads GPc2 adjacent to each other.

A region in which the upper gate pads GPa are formed may be defined as an upper gate staircase region GSa, a region in which the floating gate pads GPf are formed may be defined as a floating gate staircase region GSf, a region in which the intermediate gate pads GPb are formed may be defined as an intermediate gate staircase region GSb, a region in which the first lower gate pads GPc1 are formed may be defined as a first lower gate staircase region GSc1, and a region in which the second lower gate pads GPc2 are formed may be defined as a second lower gate staircase region GSc2.

The gate region GA of the stack structure ST' may include gate flat regions GFa, GFb, and GFc. The gate flat regions GFa, GFb, and GFc may include an upper gate flat region GFa, an intermediate gate flat region GFb, and a lower gate flat region GFc disposed in order in the first horizontal direction X.

The upper gate flat region GFa may be disposed between the floating gate staircase region GSf and the intermediate gate staircase region GSb. The upper gate flat region GFa (in FIGS. 1C and 2A) may include an upper gate flat dummy region GFd1 (in FIGS. 1C and 2A) and an upper gate flat edge region GFe1 (in FIGS. 1C and 2A). The lower gate flat region GFc may be disposed between the first lower gate staircase region GSc1 and the second lower gate staircase region GSc2.

In an example embodiment, a first dummy pattern 24dc may be disposed between the lower gate flat region GFc and the first lower gate staircase region GSc1. The first dummy pattern 24dc may be disposed on the second interlayer insulating layer 20b. In an example embodiment, the first dummy pattern 24dc may be formed of a conductive material.

A plurality of the intermediate gate staircase regions GSb may be disposed. In an example embodiment, a plurality of the intermediate gate flat regions GFb may be disposed. One of the intermediate gate flat regions GFb may be disposed between intermediate gate staircase regions GSb adjacent each other among the intermediate gate staircase regions GSb. Accordingly, one or a plurality of the intermediate gate flat regions GFb may be disposed. The intermediate gate staircase regions GSb may be disposed in order in the first horizontal direction X, and may include a first gate staircase region GSb and a second gate staircase region GSb disposed in order in the first horizontal direction X and having substantially the same cross-sectional structure, and one of the first gate staircase regions GSb may be disposed between the first gate staircase region GSb and the second gate staircase region GSb.

In the description below, the intermediate gate flat region GFb will be described with reference to FIGS. 1D and 2B.

Referring to FIGS. 1D and 2B, each of the intermediate gate pads GPb may have a first length La in the first horizontal direction X. The intermediate gate flat region GFb may include an intermediate gate flat pad region GFp2, an intermediate gate flat edge region GFe2, and an intermediate gate flat dummy region GFd2 disposed between the intermediate gate flat pad region GFp2 and the intermediate gate flat edge region GFe2. The intermediate gate flat pad region GFp2, the intermediate gate flat dummy region GFd2, and the intermediate gate flat edge region GFe2 may be disposed in order, e.g., sequentially, in the first horizontal direction X.

The intermediate gate flat pad region GFp2 may have a second length Lp greater than the first length La in the first horizontal direction X. The intermediate gate flat edge region GFe2 may have a third length Lc greater than the first length La in the first horizontal direction X. The intermediate gate flat dummy region GFd2 may have a fourth length Ld greater than each of the second length Lp and the third length Lc in the first horizontal direction X.

In an example embodiment, the second length Lp of the intermediate gate flat pad region GFp2 may be greater than the third length Lc of the intermediate gate flat edge region GFe2. In another example embodiment, the third length Lc of the intermediate gate flat edge region GFe2 may be the same as the second length Lp of the intermediate gate flat pad region GFp2. Accordingly, the second length Lp of the intermediate gate flat pad region GFp2 may be the same as or greater than the third length Lc of the intermediate gate flat edge region GFe2.

In an example embodiment, the fourth length Ld of the intermediate gate flat dummy region GFd2 may be greater than a sum of the second length Lp of the intermediate gate flat pad region GFp2 and the third length Lc of the intermediate gate flat edge region GFe2. In another example embodiment, the fourth length Ld of the intermediate gate flat dummy region GFd2 may be the same as a sum of the second length Lp of the intermediate gate flat pad region GFp2 and the third length Lc of the intermediate gate flat edge region GFe2. Accordingly, the fourth length Ld may be the same as or greater than a sum of the second length Lp and the third length Lc.

Each of the gate horizontal layers 23G may have a first thickness t1. Each of the intermediate gate flat pad region GFp2, the intermediate gate flat edge region GFe2, and the intermediate gate flat dummy region GFd2 may have a second maximum thickness t2 greater than the first thickness t1.

The gate horizontal layers 23G may include a conductive material. The intermediate gate flat pad region GFp2 and the intermediate gate flat edge region GFe2 may include the conductive material. The intermediate gate flat dummy region GFd2 may not include the conductive material, and may be filled with an insulating material. For example, the intermediate gate flat pad region GFp2 may include a first conductive layer, the intermediate gate flat edge region GFe2 may include a second conductive layer, the intermediate gate flat dummy region GFd2 may include an insulating material, and the insulating material of the intermediate gate flat dummy region GFd2 may separate the first conductive layer of the intermediate gate flat pad region GFp2 and the second conductive layer of the intermediate gate flat dummy region GFd2 from each other in the first horizontal direction X, such that the first conductive layer and the second conductive layer may be spaced apart from each other in the first horizontal direction X. The first conductive layer and the second conductive layer may include the same conducive material.

The insulating material of the intermediate gate flat dummy region GFd2 may be a portion of the first upper insulating layer 33. Accordingly, the portion of the first upper insulating layer 33 extending to a region between the intermediate gate flat pad region GFp2 and the intermediate gate flat edge region GFe2 may be defined as the intermediate gate flat dummy region GFd2.

Gate contact plugs 70g1, 70g2, 70d1 and 70d2 may be disposed in the connection region EA. In an example embodiment, the gate contact plugs may include first gate contact plugs 70g1 on the upper gate pads GPa (in FIG. 2A), the intermediate gate pads GPb, the first lower gate pads GPc1, and first gate contact plugs 70g1 on the second lower gate pads GPc2. Gate contact plugs of the first gate contact plugs 70g1, disposed on the intermediate gate pads GPb, may be referred to as first intermediate gate contact plugs. The first gate contact plugs 70g1 may be in contact with and electrically connected to the intermediate gate pads GPb on the intermediate gate pads GPb.

In an example embodiment, the gate contact plugs may further include a plurality of flat contact plugs 70g2 and 70d1 in contact with the intermediate gate flat pad region GFp2 on the intermediate gate flat pad region GFp2. The plurality of flat contact plugs 70g2 and 70d1 may include a second intermediate gate contact plug 70g2 and a first dummy gate contact plug 70d1 disposed in order in the first horizontal direction X.

In an example embodiment, the gate contact plugs may further include an edge flat contact plugs 70d2 in contact with the intermediate gate flat edge region GFe2 on the intermediate gate flat edge region GFe2. The edge flat contact plugs 70d2 may be referred to as a second dummy gate contact plug 70d2. The first dummy gate contact plug 70d1 may prevent deformation or defects of the second intermediate gate contact plug 70g2. The edge flat contact plug 70d2 may prevent deformation or defects of the first intermediate gate contact plug 70g1 adjacent to the second dummy gate contact plug 70d2. For example, when gate contact holes for forming the first and second intermediate gate contact plugs 70g1 and 70g2 and dummy contact holes for forming the first and second dummy contact plugs 70d1 and 70d2 are formed simultaneously, an etching gas of an etching process for forming the dummy contact holes and the gate contact holes may be stably supplied into the gate contact holes, e.g., oriented specifically toward the intermediate gate contact plugs, while being unstably supplied into the dummy contact holes. Accordingly, the first and second intermediate gate contact plugs 70g1 and 70g2 formed in the gate contact holes may be stably formed without defects, e.g., due to formation of the first and second dummy contact plugs 70d1 and 70d2. Accordingly, the first and second dummy contact plugs 70d1 and 70d2 may improve reliability and/or productivity of the semiconductor device.

The gate contact plugs 70g1 and 70g2, as well as the dummy contact plugs 70d1 and 70d2, may be formed of the same conductive material, such as a doped silicon, a metal nitride (e.g., TiN, WN, or the like) or a metal (e.g., tungsten, or the like). It is noted, however, that while the dummy contact plugs 70d1 and 70d2 may have a structure and shape identical or similar to that of the gate contact plugs 70g1 and 70g2, an electrical signal is not applied to the dummy contact plugs 70d1 and 70d2.

A spacing distance between the second intermediate gate contact plug 70g2 and the first dummy gate contact plug 70d1 may be less than a spacing distance between the first dummy gate contact plug 70d1 and the intermediate gate flat dummy region GFd2, e.g., along the first horizontal direction X. A spacing distance between the second intermediate gate contact plug 70g2 and the first dummy gate contact plug 70d1 may be substantially the same as a spacing distance between the first and second intermediate gate contact plugs 70g1 and 70g2, e.g., when the second intermediate gate contact plug 70g2 is between the first intermediate gate contact plug 70g1 and the first dummy gate contact plug 70d1 (left side of FIG. 2B). A spacing distance between the second intermediate gate contact plug 70g2 and the first dummy gate contact plug 70d1 may be substantially the same as a spacing distance between the second dummy gate contact plug 70d2 and the first intermediate gate contact plugs 70g1, e.g., along the first horizontal direction X. To distinguish the first intermediate gate contact plugs 70g1 adjacent to the second intermediate gate contact plug 70g2 (i.e., left side of FIG. 2B) from the first intermediate gate contact plugs 70g1 adjacent to the second dummy gate contact plug 70d2 (i.e., right side of FIG. 2B), the first intermediate gate contact plugs 70g1 adjacent to the second dummy gate contact plug 70d2 (i.e., right side of FIG. 2B) may also be referred to as a "third intermediate gate contact plug."

In an example embodiment, a length of the upper gate flat dummy region GFd1 (in FIGS. 1C and 2A) of the upper gate flat region GFa (in FIGS. 1C and 2A) in the first horizontal direction X may be greater than a length of the intermediate gate flat dummy region GFd2 of the intermediate gate flat regions GFb in the first horizontal direction X. In an example embodiment, a length of the upper gate flat edge region GFe1 (in FIGS. 1C and 2A) of the upper gate flat region GFa (in FIGS. 1C and 2A) in the first horizontal direction X may be substantially the same as a length of the upper gate flat dummy region GFd1 of the intermediate gate flat region GFb in the first horizontal direction X. The intermediate gate flat region GFb may be referred to as a first gate flat region. The upper gate flat region GFa may be referred to as a second gate flat region.

The intermediate gate flat pad region GFp2 may be referred to as a first gate flat pad region, and the intermediate gate flat edge region GFe2 may be referred to as a first gate flat edge region. The upper gate flat dummy region GFd1 may be referred to as a first gate flat dummy region. The upper gate flat dummy region GFd1 (in FIGS. 1C and 2A) may be referred to as a second gate flat dummy region, and the upper gate flat edge region GFe1 (in FIGS. 1C and 2A) may be referred to as a second gate flat edge region.

In the description below, the insulating horizontal layers 23I including the lower insulating horizontal layers 23Ia, the intermediate insulating horizontal layers 23Ib, and the floating insulating horizontal layers 23If will be described with reference to FIG. 3A.

Referring to FIG. 3A, the insulating horizontal layers 23I may include pad regions formed in a staircase shape in the connection region EA. The floating insulating horizontal layers 23If may include floating insulating pads IPf raising with a difference of the second length therebetween in the first horizontal direction X. The intermediate insulating horizontal layers 23Ib may include intermediate insulating pads IPb lowering in order in the first horizontal direction X with a difference of the first height greater than the second height and first lower insulating pads IPc1 lowering in order with a difference of the second height in the first horizontal direction X. The lower insulating horizontal layers 23Ia may include second lower insulating pads IPc2 lowering in order with a difference of the second height in the first horizontal direction X.

A region in which the floating insulating pad IPf is formed may be defined as a floating insulating staircase region ISf, a region in which the intermediate insulating pads IPb are formed may be defined as an intermediate insulating staircase region ISb, a region in which the first lower insulating pads IPc1 are formed may be defined as a first lower insulating staircase region ISc1, and a region in which the second lower insulating pads IPc2 are formed may be defined as a second lower insulating staircase region ISc2. The insulating region IA of the stack structure ST' may include insulating flat regions IFa, IFb, and IFc. The insulating flat regions IFa, IFb, and IFc may include an upper insulating flat region IFa, an intermediate insulating flat region IFb, and a lower insulating flat region IFc, disposed in order in the first horizontal direction X.

The upper insulating flat region IFa may be disposed between the floating insulating staircase region ISf and the intermediate insulating staircase region ISb. The upper insulating flat region IFa (in FIGS. 1C and 3A) may include an upper insulating flat dummy region IFd1 (in FIGS. 1C and 3A) and an upper insulating flat edge region IFe1 (in FIGS. 1C and 3A). The lower insulating flat region IFc may be disposed between the first lower insulating staircase region ISc1 and the second lower insulating staircase region ISc2.

In an example embodiment, a second dummy pattern 24di may be disposed between the lower insulating flat region IFc and the first lower insulating staircase region ISc1. The second dummy pattern 24di may be disposed on the second interlayer insulating layer 20b. In an example embodiment, the second dummy pattern 24di may be formed of an insulating material, e.g., silicon nitride.

In an example embodiment, a plurality of the intermediate insulating staircase regions ISb may be disposed. In an example embodiment, a plurality of the intermediate insulating flat regions IFb may be disposed. One of the plurality of intermediate insulating flat regions IFb may be disposed between intermediate insulating staircase regions adjacent to each other among a plurality of the intermediate insulating staircase region ISb. Accordingly, one or a plurality of the intermediate insulating flat regions IFb may be disposed.

Peripheral contact plugs 71 penetrating through the first, second, and third upper insulating layers 33, 53, and 65, the stack structure ST', and the gap-fill insulating layer 13, extending downwardly, and electrically connected to the peripheral contact pads 8P may be disposed. Gate connection wirings 74g1 may be disposed on the peripheral contact plugs 71. The upper flat region FAa may include the upper gate flat region GFa and the upper insulating flat region IFa adjacent to each other in the second horizontal direction Y. One or a plurality of the intermediate flat regions Fab may include one or a plurality of the intermediate gate flat regions GFb, and one or the plurality of the intermediate insulating flat regions IFb, adjacent to each other in the second horizontal direction Y. The lower flat region FAc may include the lower gate flat region GFc and the lower insulating flat region IFc adjacent to each other in the second horizontal direction Y.

One or a plurality of the intermediate gate flat regions GFb may be referred to as a first flat region, the lower flat region FAc may be referred to as a second flat region, and the upper flat region FAa may be referred to as a third flat region. The gate contact plugs 70g1, 70g2, 70d1 and 70d2 (in FIG. 2B) may be disposed on the gate region GA of the stack structure ST', and the peripheral contact plugs 71 may penetrate through the insulating region IA of the stack structure ST'.

In the description below, the intermediate insulating flat region IFb will be described with reference to FIGS. 1D and 3B.

Referring to FIGS. 1D and 3B, each of the intermediate insulating pads IPb may have the first length La in the first horizontal direction X. The intermediate insulating flat region IFb may include an intermediate insulating flat pad region IFp2, an intermediate insulating flat edge region IFe2, and an insulating flat dummy region IFd2 disposed between the intermediate insulating flat pad region IFp2 and the intermediate insulating flat edge region IFe2. The intermediate insulating flat pad region IFp2, the insulating flat dummy region IFd2, and the intermediate insulating flat edge region IFe2 may be disposed in order in the first horizontal direction X.

The intermediate insulating flat pad region IFp2 may have the second length Lp in the first horizontal direction X similarly to the intermediate gate flat pad region GFp2 (in FIGS. 1D and 2B). The intermediate insulating flat edge region IFe2 may have the third length Lc in the first horizontal direction X similarly to the intermediate gate flat edge region GFe2 (in FIGS. 1D and 2B). The insulating flat dummy region IFd2 may have the fourth length Ld in the first horizontal direction X similarly to the intermediate gate flat dummy region GFd2 (in FIGS. 1D and 2B).

Similarly to the intermediate gate flat region GFb (in FIGS. 1D and 2B), the second length Lp of the intermediate insulating flat pad region IFp2 may be the same as or greater than the third length Lc of the intermediate insulating flat dummy region IFd2. The fourth length Ld may be greater than each of the second length Lp and the third length Lc. The fourth length Ld may be the same as or greater than a sum of the second length Lp and the third length Lc.

In an example embodiment, a length of the upper insulating flat dummy region IFd1 (in FIGS. 1C and 3A) of the upper insulating flat region IFa (in FIGS. 1C and 3A) in the first horizontal direction X may be greater than a length of the insulating flat dummy region IFd2 of the intermediate insulating flat region IFb in the first horizontal direction X.

In an example embodiment, a length of the upper insulating flat edge region IFe1 of the upper insulating flat region IFa (in FIGS. 1C and 3A) in the first horizontal direction X may be substantially the same as a length of the intermediate insulating flat edge region IFd1 of the intermediate insulating flat region IFb in the first horizontal direction X.

Each of the insulating horizontal layers 23I may be formed of a first insulating material layer 24a. Each of the intermediate insulating flat pad region IFp2, the intermediate insulating flat edge region IFe2, and the intermediate insulating pads IPb may include the first insulating material layer 24a and a second insulating material layer 24b disposed on the first insulating material layer 24a. The second insulating material layer 24b may have a thickness less than a thickness of the first insulating material layer 24a. The first insulating material layer 24a may be formed of a first silicon nitride, and the second insulating material layer 24b may be formed of a second silicon nitride which may be etched at a speed higher than that of etching the first silicon nitride.

In an example embodiment, the insulating flat dummy region IFd2 may be formed of a material different from materials of the first and second insulating material layers 24a and 24b, e.g., silicon oxide. The insulating flat dummy region IFd2 may be formed of a material the same as a material of the intermediate gate flat dummy region GFd2 (in FIG. 2B). The insulating flat dummy region IFd2 may separate the first insulating material layer of the intermediate insulating flat pad region IFp2 from the second insulating material layer of the insulating flat dummy region IFd2 such that the first insulating material layer may be spaced apart from the second insulating material layer.

In an example embodiment, each of the lower gate flat region GFc (in FIGS. 1B and 2A) and the lower insulating flat region IFc (in FIGS. 1B and 3A) may have a length greater than the first length La of each of the intermediate gate pads GPb in the first horizontal direction X. In an example embodiment, each of the lower gate flat region GFc (in FIGS. 1B and 2A) and the lower insulating flat region IFc (in FIGS. 1B and 2A) may have a length greater than the third length Lc of each of the intermediate insulating flat edge region IFe2 and the intermediate gate flat edge region GFe2 (in FIGS. 1B and 2A) in the first horizontal direction X. In an example embodiment, each of the lower gate flat region GFc (in FIGS. 1B and 2A) and the lower insulating flat region IFc (in FIGS. 1B and 3A) may have a length greater than the second length Lp of each of the intermediate insulating flat pad region IFp2 and the intermediate gate flat pad region GFp2 (in FIGS. 1B and 2A) in the first horizontal direction X.

Figure 4A:
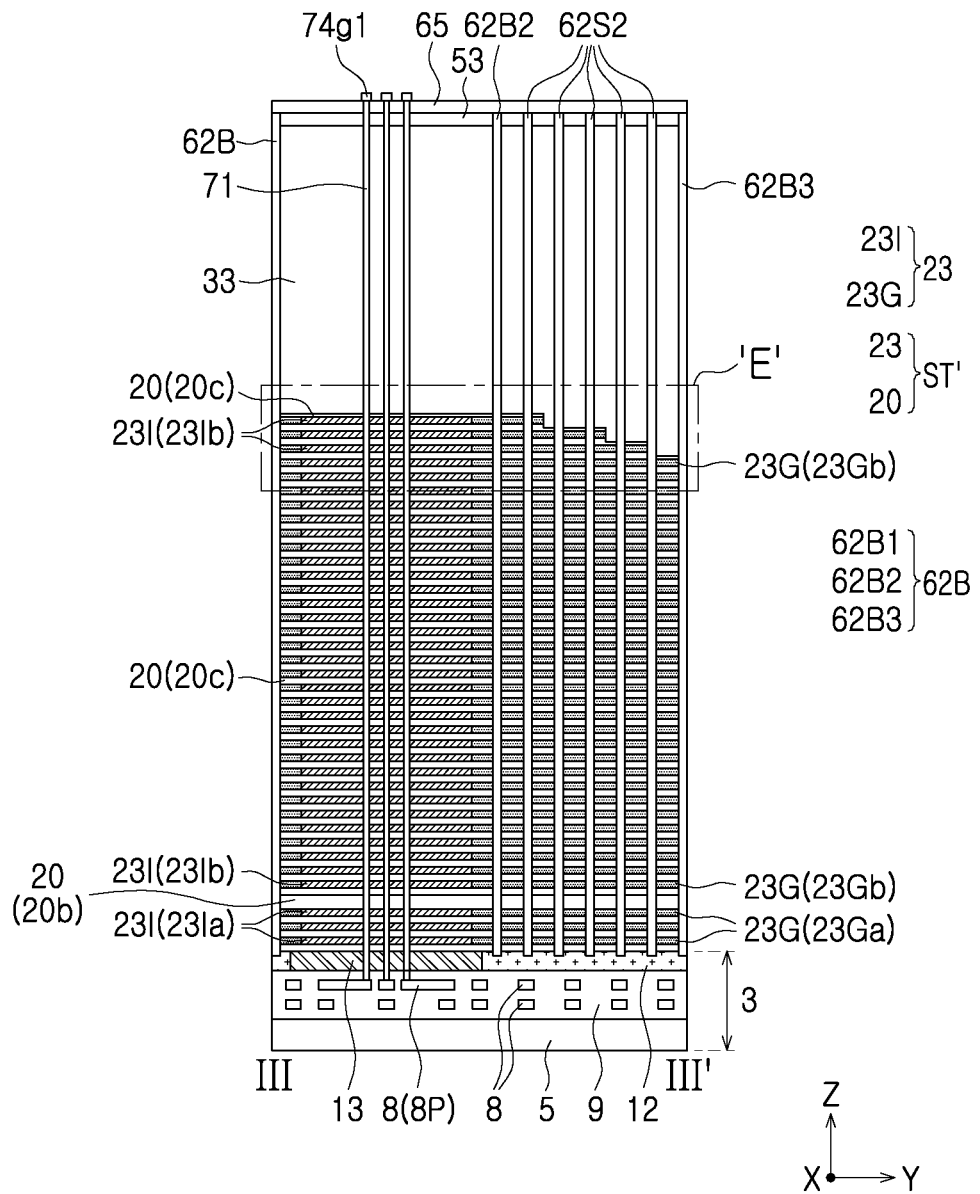
Figure 4B:
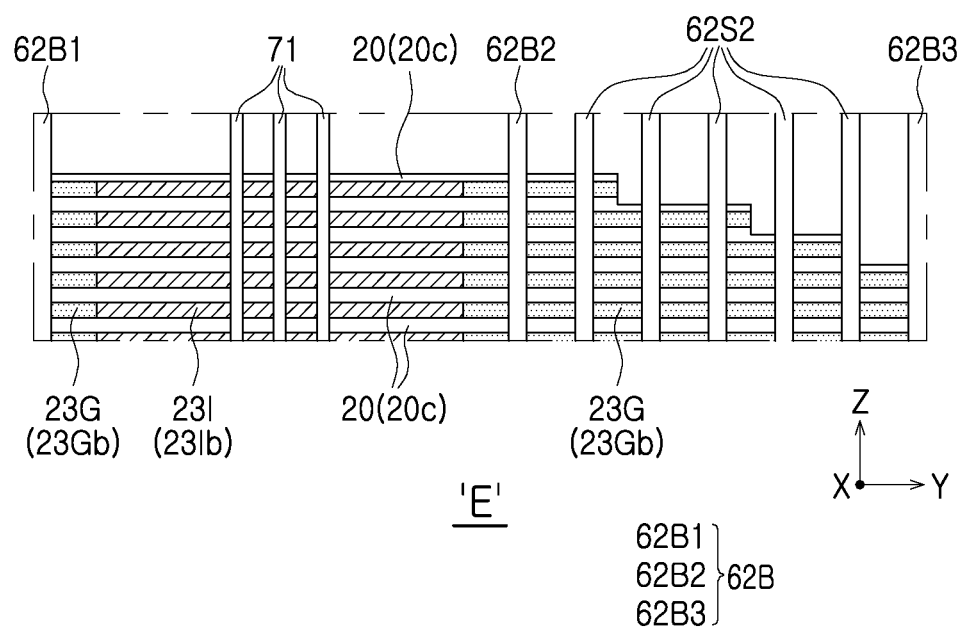
Figure 5A:
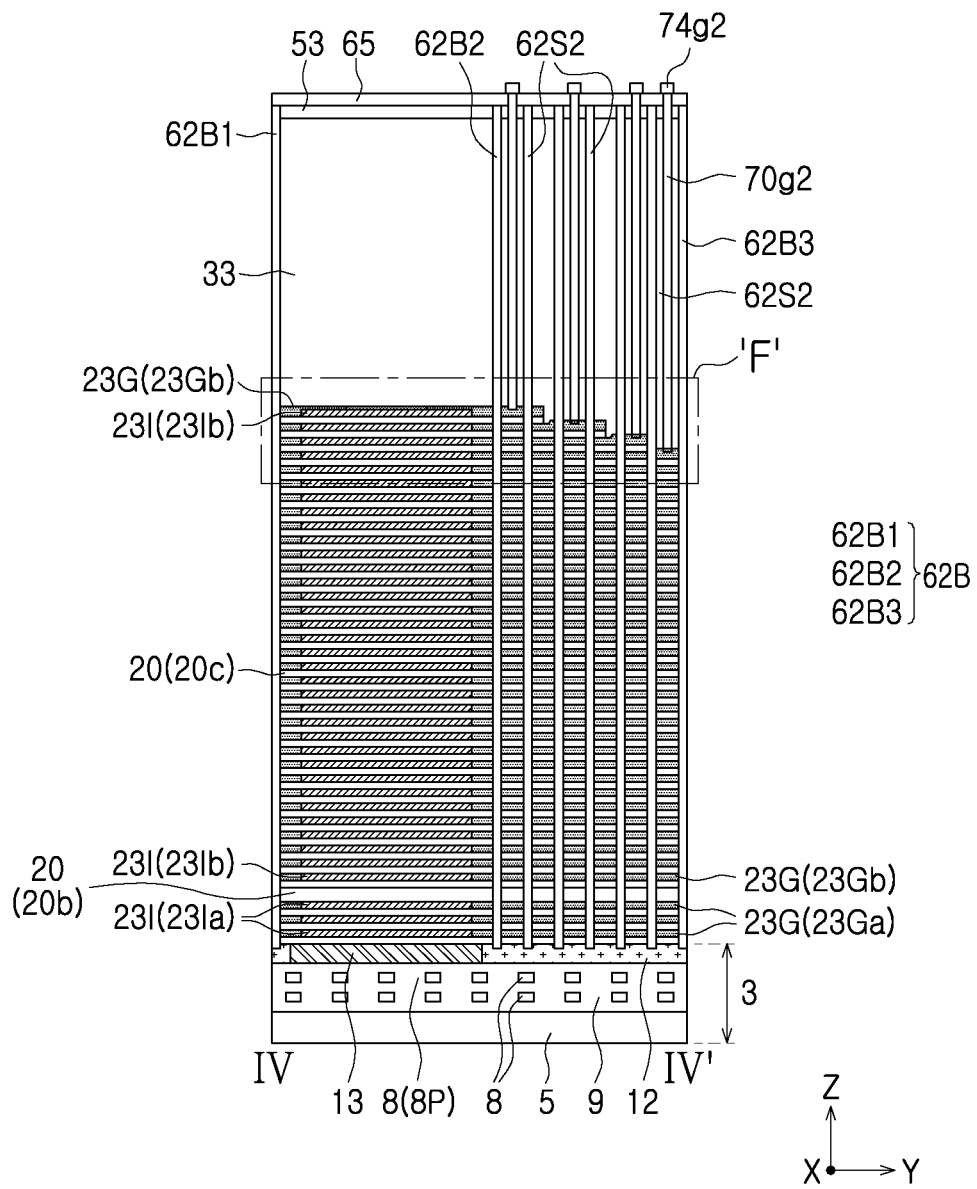

A cross-sectional structure of the semiconductor device including the stack structure ST' in the connection region EA will be described with reference to FIGS. 4A to 5B. FIG. 4A is a cross-sectional diagram along line in FIG. 1D, FIG. 4B is an enlarged diagram of portion "E" in FIG. 4A, FIG. 5A is a cross-sectional diagram along line IV-IV' in FIG. 1D, and FIG. 5B is an enlarged diagram of portion "F" in FIG. 5A.

Figure 5B:
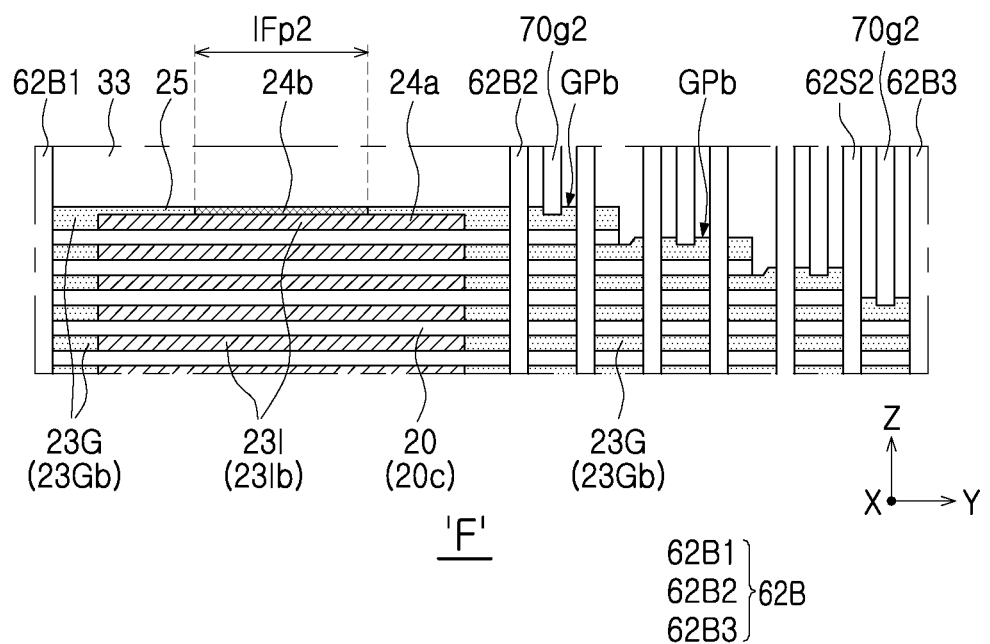

Referring to FIGS. 1D, 4A, and 5B, block separation structures 62B may include first to third block separation structures 62B1, 62B2, and 62B3. An upper surface of the stack structure ST' may be planar between the first and second block separation structures 62B1 and 62B2. The insulating region IA may be disposed between the first and second block separation structures 62B1 and 62B2, and may be spaced apart from the first and second block separation structures 62B1 and 62B2. The stack structure ST' may be configured to have a staircase structure lowering in the second horizontal direction Y between the second and third block separation structures 62B2 and 62B3. For example, the intermediate gate pads GPb (in FIG. 2A) may be lowered in the first horizontal direction X with a difference of the first height therebetween, and may be lowered in the second horizontal direction Y with a difference of the second height therebetween, smaller than the first height.

The second auxiliary separation structures 62S2 may penetrate through the stack structure ST' disposed between the second and third block separation structures 62B2 and 62B3.

The block separation structures 62B, the second auxiliary separation structures 62S2, and the first auxiliary separation structures 62S1 (in FIGS. 1A and 1B) may have the same cross-sectional structure. The block separation structures 62B, the second auxiliary separation structures 62S2, and the first auxiliary separation structures 62S1 (in FIGS. 1A and 1B) may penetrate through the second upper insulating layer 53, the first upper insulating layer 33, and the stack structure ST' in order.

The cross-sectional structure in FIG. 5B, obtained by cutting out the intermediate insulating flat pad region IFp2 and the intermediate gate flat pad region GFp2 in the second horizontal direction Y, will be described.

The intermediate insulating flat pad region IFp2 may include the first insulating material layer 24a and the second insulating material layer 24b on the first insulating material layer 24a as in the example embodiment described with reference to FIGS. 1D and 3B.

In the region in which the intermediate insulating flat pad region IFp2 is disposed, the intermediate gate horizontal layer of the intermediate gate horizontal layers 23Gb, adjacent to the intermediate insulating flat pad region IFp2, may further include a gate extension portion 25 extending to an upper surface of the first insulating material layer 24a included in the intermediate insulating flat pad region IFp2 and in contact with the second insulating material layer 24b of the intermediate insulating flat pad region IFp2. The gate extension portion 25 may be formed of a conductive material.

Figure 6:
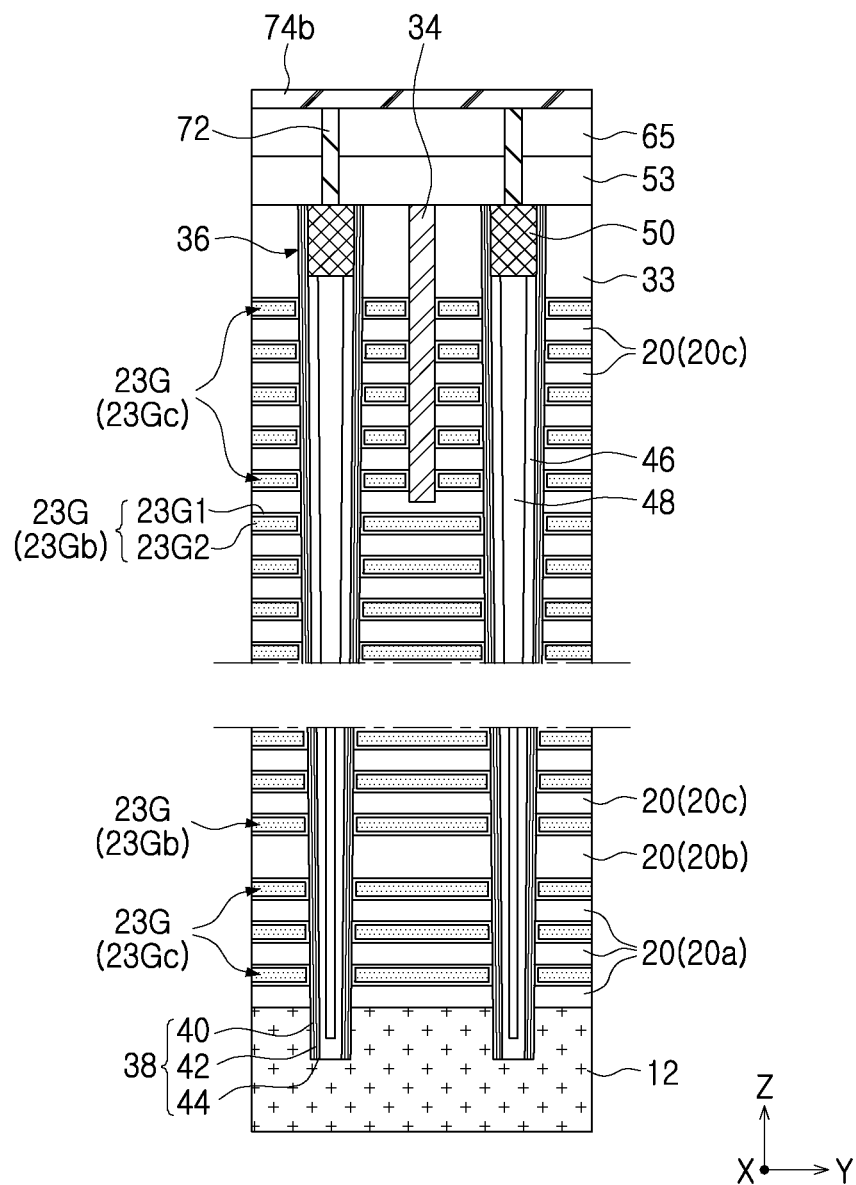
FIG. 6 is a cross-sectional diagram illustrating an example of a portion of elements of a semiconductor device according to an example embodiment.

The memory vertical structure 36 (in FIGS. 2A and 3A) in the memory cell array region MA will be described with reference to FIG. 6. FIG. 6 is a cross-sectional structure taken in the second horizontal direction Y with reference to the insulating separation pattern 34 (in FIG. 1B) in the memory cell array region MA.

Referring to FIG. 6, the insulating separation pattern 34 may penetrate through the first upper insulating layer 33, may extend downwardly, and may penetrate through the gate horizontal layers 23G. The memory vertical structure 36 may include a core region 48, a pad pattern 50 on the core region 48, a channel layer 46 covering a side surface and a bottom surface of the core region 48 and in contact with the pad pattern 50, and a dielectric structure 38 enclosing an external side surface of the channel layer 46.

The channel layer 46 may be formed of a semiconductor material. The channel layer 46 may be formed of, e.g., polysilicon. The pad pattern 50 may be formed of, e.g., doped polysilicon, polysilicon having N-type conductivity, for example. The pad pattern 50 may be in contact with the contact plug 90. The core region 48 may include an insulating material, or an insulating material having a void formed therein.

The dielectric structure 38 may include a first dielectric layer 40, a second dielectric layer 44, and a data storage material layer 42 disposed between the first dielectric layer 40 and the second dielectric layer 44. The first dielectric layer 40 may be disposed between the data storage material layer 42 and the stack structure ST', and the second dielectric layer 44 may be disposed between the data storage material layer 42 and the channel layer 46.

In an example embodiment, the data storage material layer 42 may be configured as an electric charge trapping layer, e.g., silicon nitride. The data storage material layer 42 may include regions which may store data in a semiconductor device, e.g., a vertical-type NAND flash memory device.

In an example embodiment, at least a lowermost gate layer of the lower gate horizontal layers 23Ga may be a gate layer of an erase transistor used for an erase operation of a vertical-type NAND flash memory device using a gate induced drain leakage (GIDL) phenomenon. A gate layer of the lower gate horizontal layers 23Ga, disposed on the erase transistor gate layer used for an erase operation, may be a ground select gate layer of a ground select transistor.

In an example embodiment, a portion of the intermediate gate horizontal layers 23Gb may be word lines of a vertical-type NAND flash memory device included in memory cells.

In an example embodiment, at least an uppermost gate layer of the upper gate horizontal layers 23Gc may be a gate layer of an erase transistor used for an erase operation of a vertical-type NAND flash memory device using a gate induced drain leakage (GIDL) phenomenon.

In an example embodiment, one or a plurality of the gate layers of the upper gate horizontal layers 23Gc, disposed in a lower portion of a gate layer of the erase transistor, may be gate layers of a string select transistor of the vertical-type NAND flash memory device.

In an example embodiment, each of the gate horizontal layers 23G may include a first layer 23G1 and a second layer 23G2. The first layer 23G1 may be interposed between the second layer 23G2 and the memory vertical structure 36 and may cover an upper surface and a lower surface of the second layer 23G2.

In an example embodiment, the first layer 23G1 and the second layer 23G2 may be formed of different materials. For example, the second layer 23G2 may be formed of a conductive material, such as a doped silicon, a metal nitride (e.g., TiN, WN, or the like), a metal-semiconductor compound (e.g., TiSi, WSi, or the like), or a metal (e.g., W, or the like), and the first layer 23G1 may be formed of an insulating material. The first layer 23G1 may be formed of a high-k dielectric, e.g., aluminum oxide, or the like. In another example embodiment, the first layer 23G1 may be formed of a metal nitride (e.g., TiN, WN, or the like), and the second layer 23G2 may be formed of a metal (e.g., W, or the like). In yet another example embodiment, each of the gate horizontal layers 23G may be formed of a single conductive material, such as a doped silicon, a metal nitride (e.g., TiN, WN, or the like), a metal-semiconductor compound (e.g., TiSi, WSi, or the like), or a metal (e.g., W, or the like).

In an example embodiment, the dielectric structure 38 may include the data storage material layer 42 including regions which may store data of a vertical-type NAND flash memory device, but an example embodiment thereof is not limited thereto. For example, the dielectric structure 38 may include a data storage material layer which may store data of a resistance change memory (ReRAM) device or a data storage material layer which may store data of a PRAM device, instead of the data storage material layer 42.

Figure 7A:
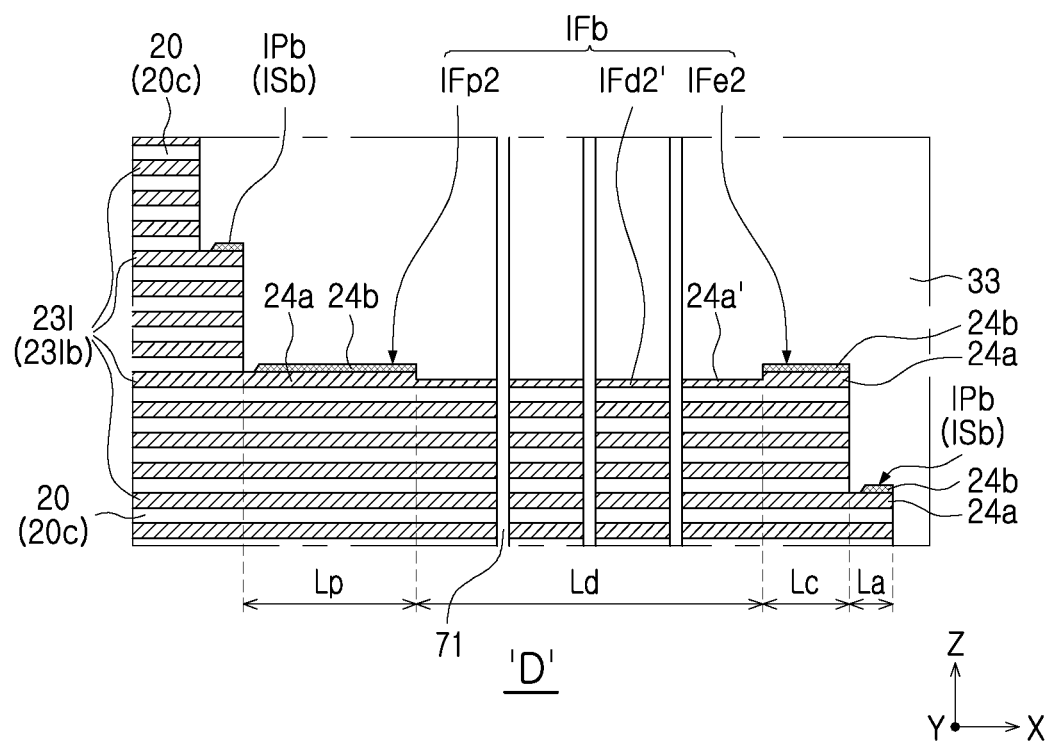
FIGS. 7A and 7B are enlarged cross-sectional diagrams illustrating a modified example of a semiconductor device according to an example embodiment.

Referring back to FIG. 3B, as described above, the intermediate insulating flat dummy region IFd2 may not include the first insulating material layer 24a and the second insulating material layer 24b. The intermediate insulating flat dummy region IFd2 (in FIG. 3B) may be, however, modified to form an intermediate insulating flat dummy region IFd2' as in FIG. 7A. FIG. 7A is an enlarged diagram illustrating a modified example of the intermediate insulating flat dummy region IFd2 illustrated in FIG. 3B.

In the modified example embodiment, referring to FIG. 7A, the intermediate insulating flat dummy region IFd2 (in FIG. 3B) may be replaced with the intermediate insulating flat dummy region IFd2' illustrated in FIG. 7A. The intermediate insulating flat dummy region IFd2' may have a reduced thickness and may extend from the first insulating material layer 24a of the intermediate insulating flat plug region IFp2 and the intermediate insulating flat edge region IFe2. Accordingly, the intermediate insulating flat dummy region IFd2' may include a first insulating material layer 24a', e.g., that is continuous and integral with the first insulating material layer 24a, that has a reduced thickness relative to the first insulating material layer 24a, e.g., along the vertical direction Z.

A minimum thickness of the first insulating material layer 24a' of the intermediate insulating flat dummy region IFd2' may be less than a maximum thickness of the intermediate insulating flat pad region IFp2 and a maximum thickness of the first insulating material layer 24a of the intermediate insulating flat edge region IFe2, e.g., along the vertical direction Z. The intermediate insulating flat dummy region IFd2' may not include the second insulating material layer 24b.

Figure 7B:
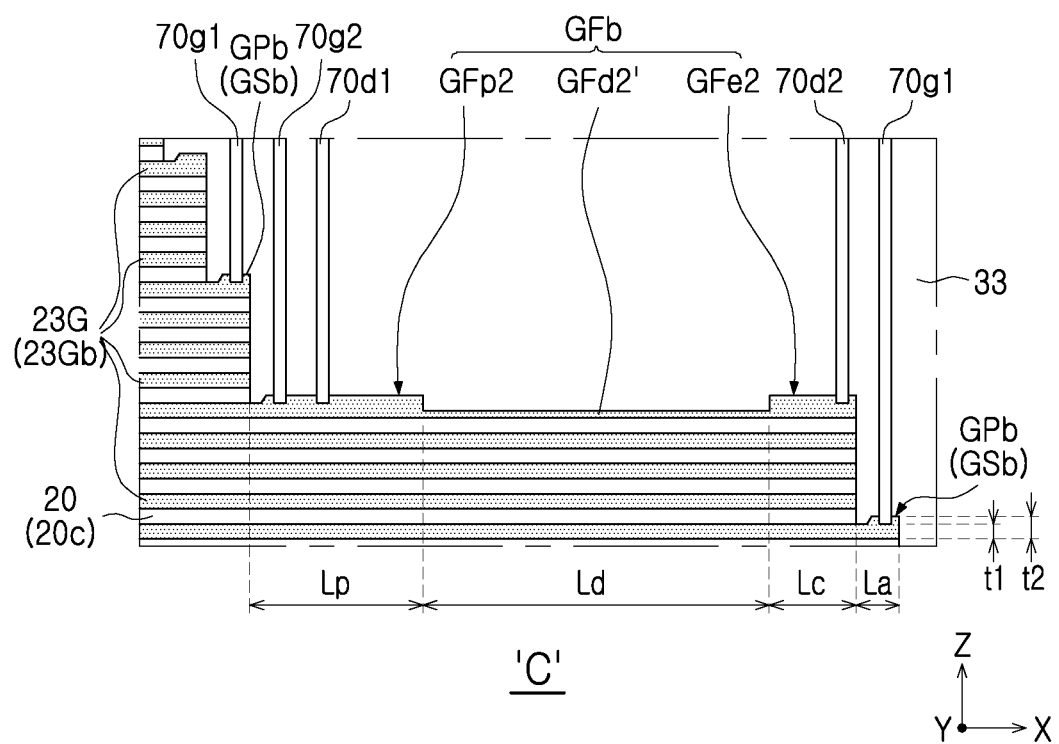

Referring back to FIG. 2B, as described above, the intermediate gate flat dummy region GFd2 may not include a conductive material and may be formed of an insulating material. The intermediate gate flat dummy region GFd2 (in FIG. 2B) may be modified to an intermediate gate flat dummy region GFd2' as in FIG. 7B. FIG. 7B is an enlarged diagram illustrating a portion illustrated in FIG. 2B, illustrating a modified example of the intermediate gate flat dummy region GFd2 (in FIG. 2B).

In the modified example embodiment, referring to FIG. 7B, the intermediate gate flat dummy region GFd2 (in FIG. 2B) may be replaced with the intermediate gate flat dummy region GFd2' illustrated in FIG. 7B.

As illustrated in FIG. 7B, the intermediate gate flat pad region GFp2 may include a first conductive layer, and the intermediate gate flat edge region GFe2 may include a second conductive layer. The intermediate gate flat dummy region GFd2' may include a third conductive layer having a reduced thickness and extending from the first conductive layer of the intermediate gate flat pad region GFp2 and the second conductive layer of the intermediate gate flat edge region GFe2. The first conductive layer, the third conductive layer, and the second conductive layer may extend consecutively without a boundary surface therebetween, e.g., may be integral with each other as a single and uniform layer. The first conductive layer of the gate flat pad region GFp2 and the second conductive layer of the gate flat edge region GFe2 may have the same maximum thickness. A maximum thickness of each of the first and second conductive layers may be greater than a minimum thickness of the third conductive layer of the intermediate gate flat dummy region GFd2', e.g., along the vertical direction Z.

Figure 8:
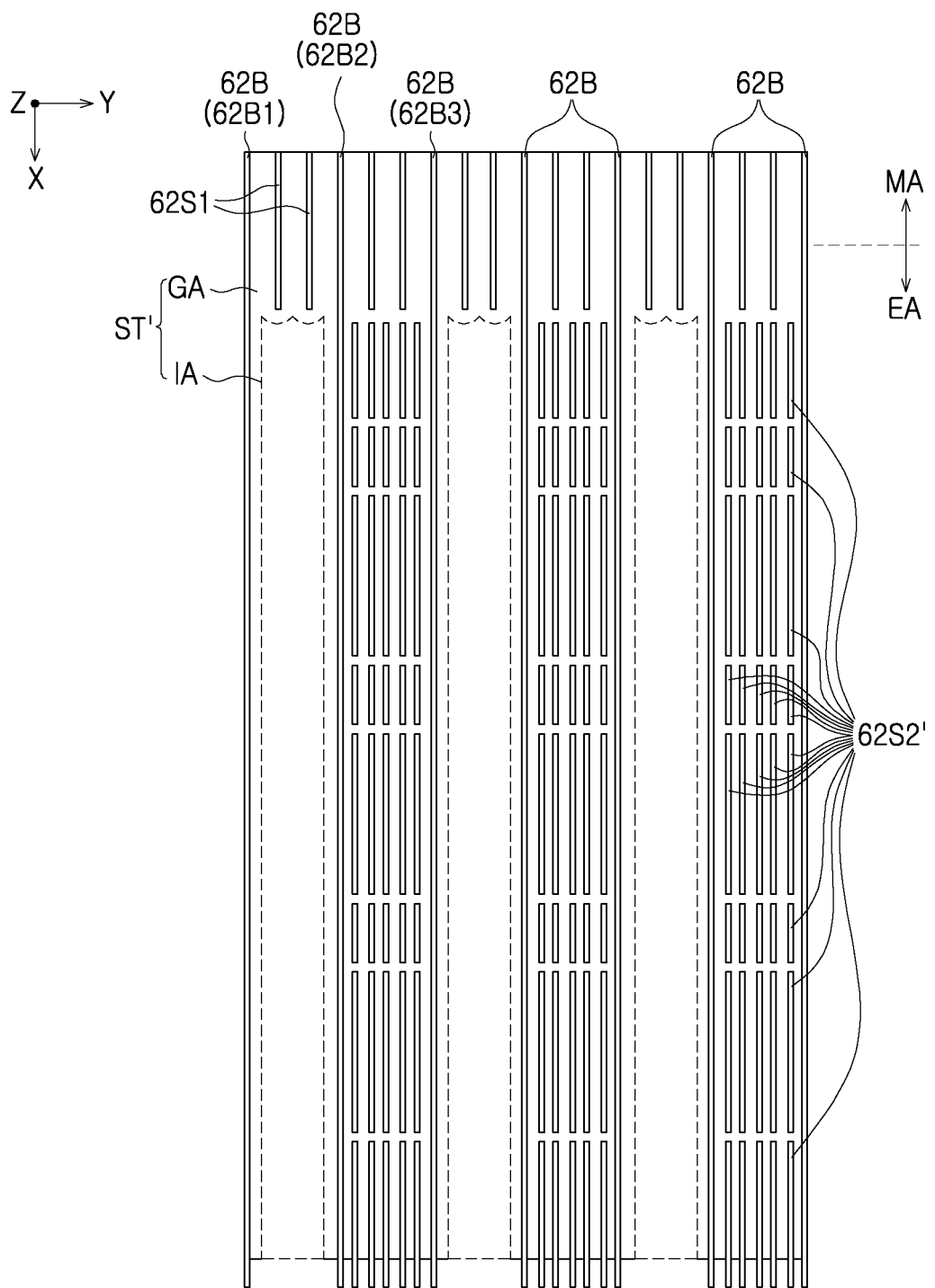
FIG. 8 is a plan diagram illustrating a modified example of a semiconductor device according to an example embodiment.

Referring to FIG. 1A, each of the second auxiliary separation structures 62S2 may have a line shape consecutively connected to each other in the first horizontal direction X, but an example embodiment thereof is not limited thereto. Each of the second auxiliary separation structures 62S2 may be modified to form second auxiliary separation structures 62S2' illustrated in FIG. 8. FIG. 8 is a plan diagram illustrating a modified example of the second auxiliary separation structures 62S2 illustrated in FIG. 1A.

Referring to FIG. 8, the second auxiliary separation structures 62S2 (in FIG. 1A) may be replaced with the second auxiliary separation structures 62S2' illustrated in FIG. 8. Each of the second auxiliary separation structures 62S2' may include a plurality of line patterns spaced apart from each other in the first horizontal direction X.

Figure 9:
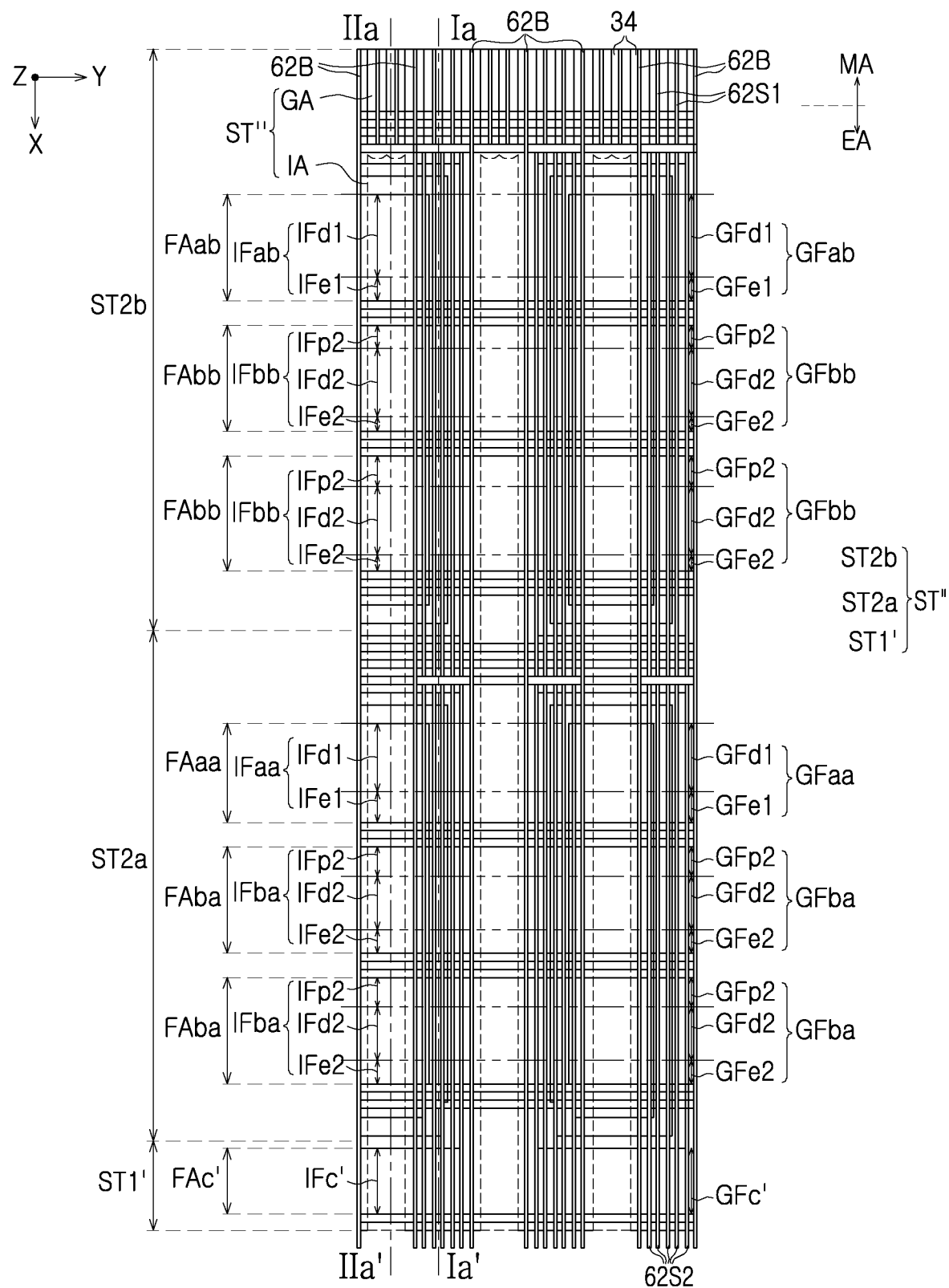
FIGS. 9 to 10B are diagrams illustrating a modified example of a semiconductor device according to an example embodiment.
Figure 10A:
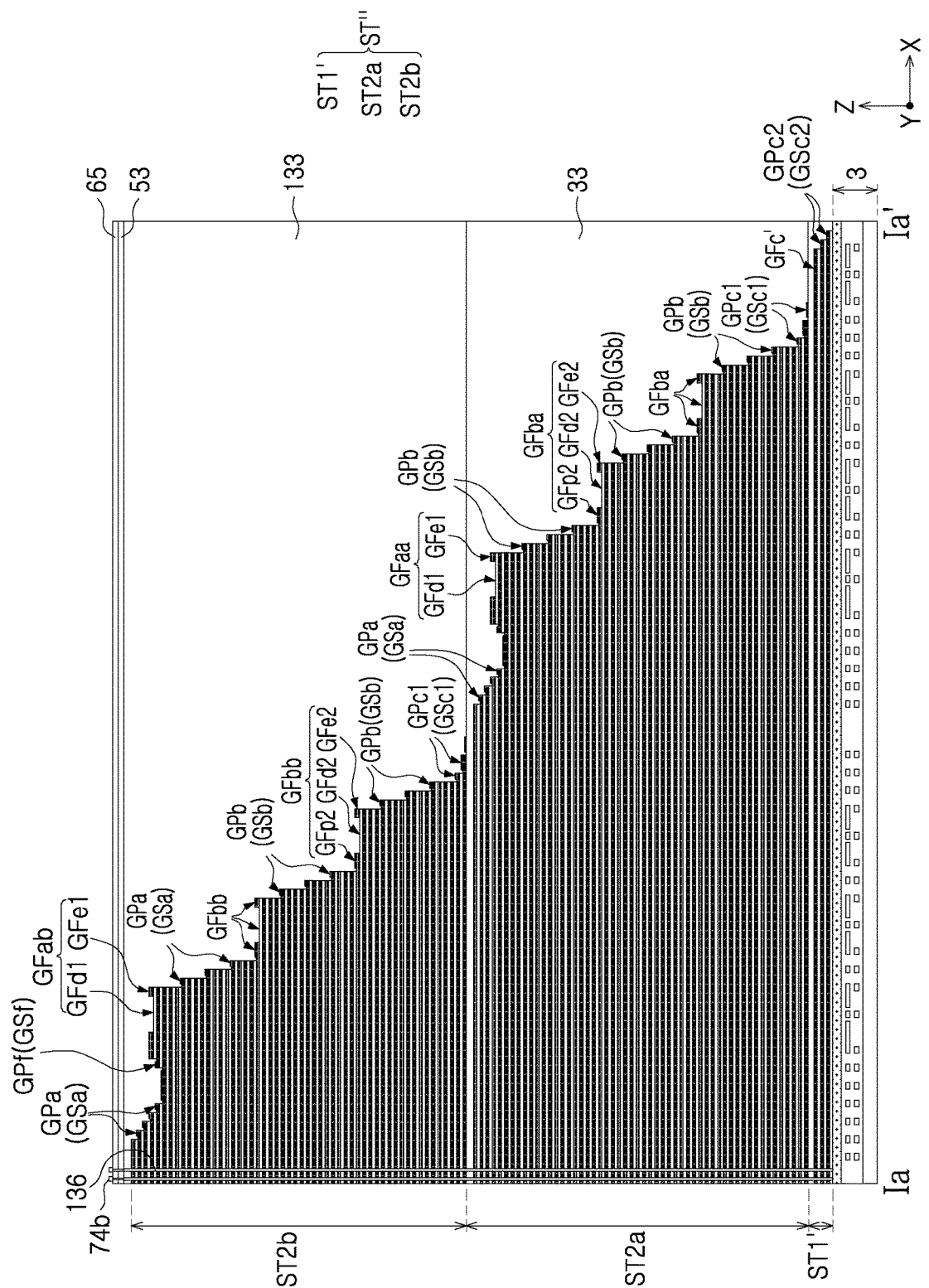
Figure 10B:
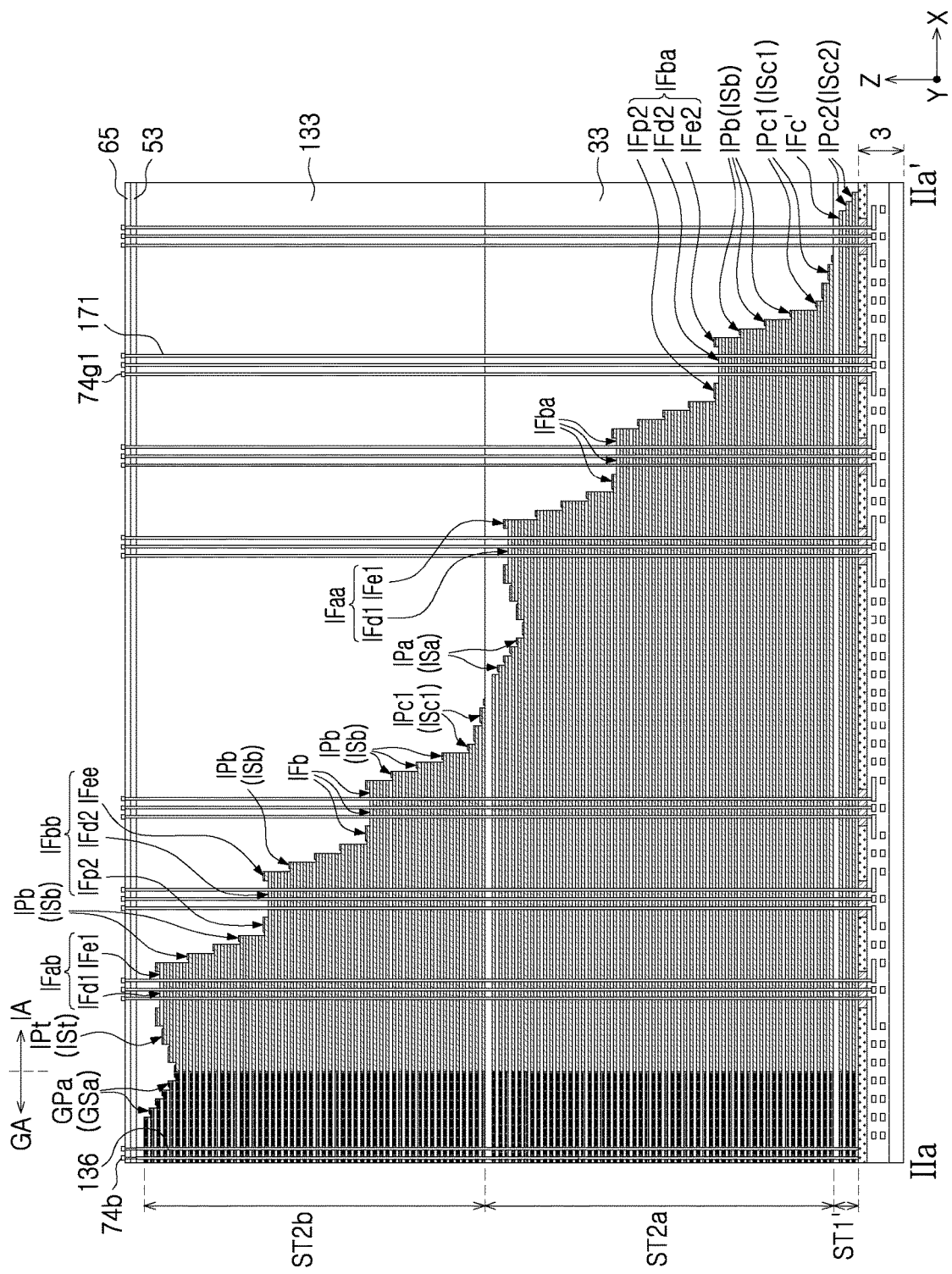

In the description below, a modified example of a semiconductor device will be described with reference to FIGS. 9 and 10A-10B. FIG. 9 is a plan diagram illustrating a modified example of a semiconductor device according to an example embodiment, FIG. 10A is a cross-sectional diagram along line Ia-Ia' in FIG. 9, and FIG. 10B is a cross-sectional diagram along line IIa-IIa' in FIG. 9. Overlapping descriptions will not be provided, and a modified portion will mainly be described.

Referring to FIGS. 9, 10A, and 10B, substantially the same memory cell array region MA and the same connection region EA, described with reference to FIGS. 1A to 5B, may be provided. A stack structure ST" disposed in the same memory cell array region MA and extending into the connection region EA may be disposed. The stack structure ST" may include substantially the same gate region GA and the same insulating region IA described with reference to FIGS. 1A to 5B. The plurality of separation structures 62B, 62S1, and 62S2, substantially the same as in the example embodiment described with reference to FIGS. 1A to 5B may be disposed. The second auxiliary separation structures 62S2 of the plurality of separation structures 62B, 62S1, and 62S2 disposed in the connection region EA may be configured to have a line shape extending in the first horizontal direction X as in FIGS. 1A and 1B, or bar shapes spaced apart from each other in the first horizontal direction X as in FIG. 8.

The lower structure 3 described with reference to FIGS. 1A to 5B may be disposed. The lower stack structure ST1' having a shape substantially the same as in the aforementioned example embodiment may be disposed on the lower structure 3. For example, the lower stack structure ST1' may include a lower flat region FAc' corresponding to the lower flat region FAc (in FIG. 1B), and the lower flat region FAc' may include a lower gate flat region GFc' and a lower insulating flat region IFc' corresponding to the lower gate flat region GFc (in FIG. 1B) and the lower insulating flat region IFc (in FIG. 1B), respectively. The lower stack structure ST1' may include the second lower gate staircase region GSc2 in which the second lower gate pads GPc2 is formed, and the second lower insulating staircase region ISc2 in which the second lower insulating pads IPc2 is formed.

A first upper stack structure ST2a having a shape substantially the same as that of the upper stack structure ST2' described with reference to FIGS. 1A to 3B may be disposed on the lower stack structure ST1'. The first upper insulating layer 33, the same as in the aforementioned example embodiment, may be disposed on the lower stack structure ST1' and the first upper stack structure ST2a.

The first upper stack structure ST2a may include one or the plurality of intermediate flat regions Fab (in FIG. 1B) described in the aforementioned example embodiment, one or the plurality of first intermediate flat regions FAba corresponding to the upper flat region FAa (in FIG. 1B), and a first upper flat region FAaa. The one or a plurality of first intermediate flat regions FAba may include the one or the plurality of the intermediate gate flat regions GFb (in FIG. 1B), and the one or the plurality of intermediate gate flat regions GFba (in FIG. 1B) corresponding to one or the plurality of single intermediate insulating flat regions IFb (in FIG. 1B). The first upper flat regions FAaa may include a first upper gate flat region GFaa and a first upper insulating flat region IFaa corresponding to the upper gate flat region GFa (in FIG. 1B) and the upper insulating flat region IFa (in FIG. 1B), respectively.

A second upper stack structure ST2b having a shape substantially the same as that of the upper stack structure ST2' described with reference to FIGS. 1A to 3B may be disposed on the first upper insulating layer 33. An additional upper insulating layer 133 may be disposed on the first upper insulating layer 33 and the second upper stack structure ST2b.

The second upper stack structure ST2b may include the one or the plurality of intermediate flat regions Fab (in FIG. 1B), one or a plurality of second intermediate flat regions FAbb corresponding to the upper flat region FAa (in FIG. 1B), and a second upper flat region FAab. The one or a plurality of second intermediate flat regions FAbb may include the one or the plurality of intermediate gate flat regions GFb (in FIG. 1B) described in the aforementioned example embodiment, one or a plurality of second intermediate gate flat regions GFbb corresponding to the one or the plurality of intermediate insulating flat regions IFb (in FIG. 1B), and one or a plurality of second intermediate insulating flat regions IFbb. The second upper flat regions FAab may include a second upper gate flat region GFab and a second upper insulating flat region IFab corresponding to the upper gate flat region GFa (in FIG. 1B) and the upper insulating flat regions IFa (in FIG. 1B), respectively.

In the cross-sectional structure illustrated in FIG. 10A, each of the first and second upper stack structures ST2a and ST2b may include the intermediate gate staircase region GSb on which the intermediate gate pads GPb are formed, the floating gate staircase region GSf on which the floating gate pads GPf are formed, and the upper gate staircase region GSa on which the upper gate pads GPa are formed.

In the cross-sectional structure illustrated in FIG. 10B, each of the first and second upper stack structures ST2a and ST2b may include the intermediate insulating staircase region ISb in which the intermediate insulating pads IPb are formed, and the floating insulating staircase region ISf in which the floating insulating pad IPf is formed. In the cross-sectional structure illustrated in FIG. 10B, the first upper stack structure ST2a may further include an upper insulating staircase region Isa in which the upper insulating pads IPa, each having a cross-sectional shape substantially the same as that of the upper gate staircase region GSa including the upper gate pads GPa, is formed, and the second upper stack structure ST2b may further include the upper gate staircase region GSa in which the upper gate pads GPa are disposed as in FIG. 3A.

The stack structure ST" may include the lower stack structure ST1', the first upper stack structure ST2a, and the second upper stack structure ST2b.

A memory vertical structure 136 penetrating through the additional upper insulating layer 133, the second upper stack structure ST2b, the first upper stack structure ST2a, and the first stack region ST1 in order may be disposed. The memory vertical structure 136 may include the elements substantially the same as the elements included in the memory vertical structure 36 described with reference to FIG. 6.

The second and third upper insulating layers 53 and 65 described in the aforementioned example embodiment may be disposed on the additional upper insulating layer 133. Also, peripheral contact plugs 171 and the gate connection wirings 174g1, corresponding to the peripheral contact plugs 71 and the gate connection wirings 74g1, respectively, may be disposed.

Figure 11A:
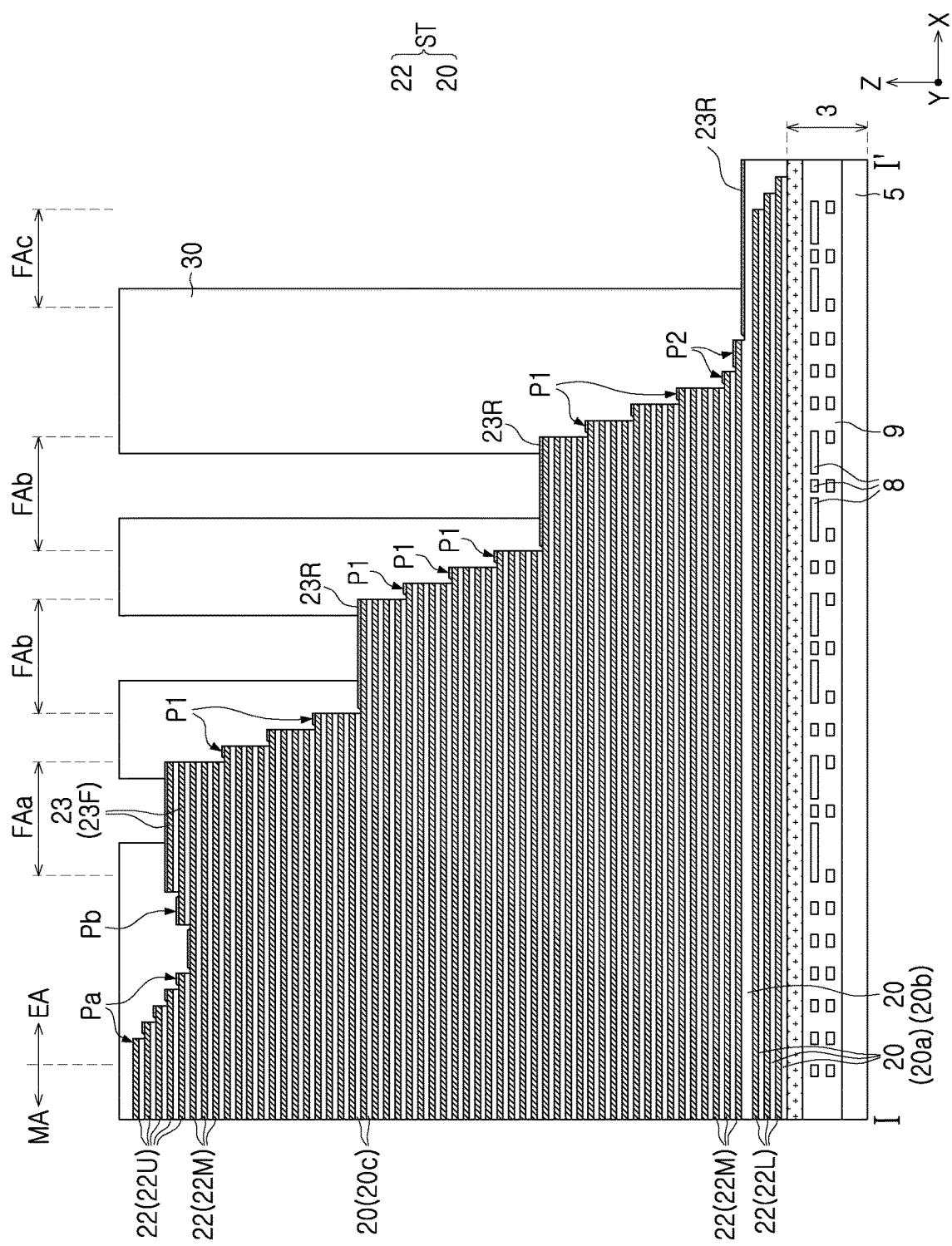
FIGS. 11A to 12C are diagrams illustrating an example of stages in a method of manufacturing a semiconductor device according to an example embodiment.
Figure 11B:
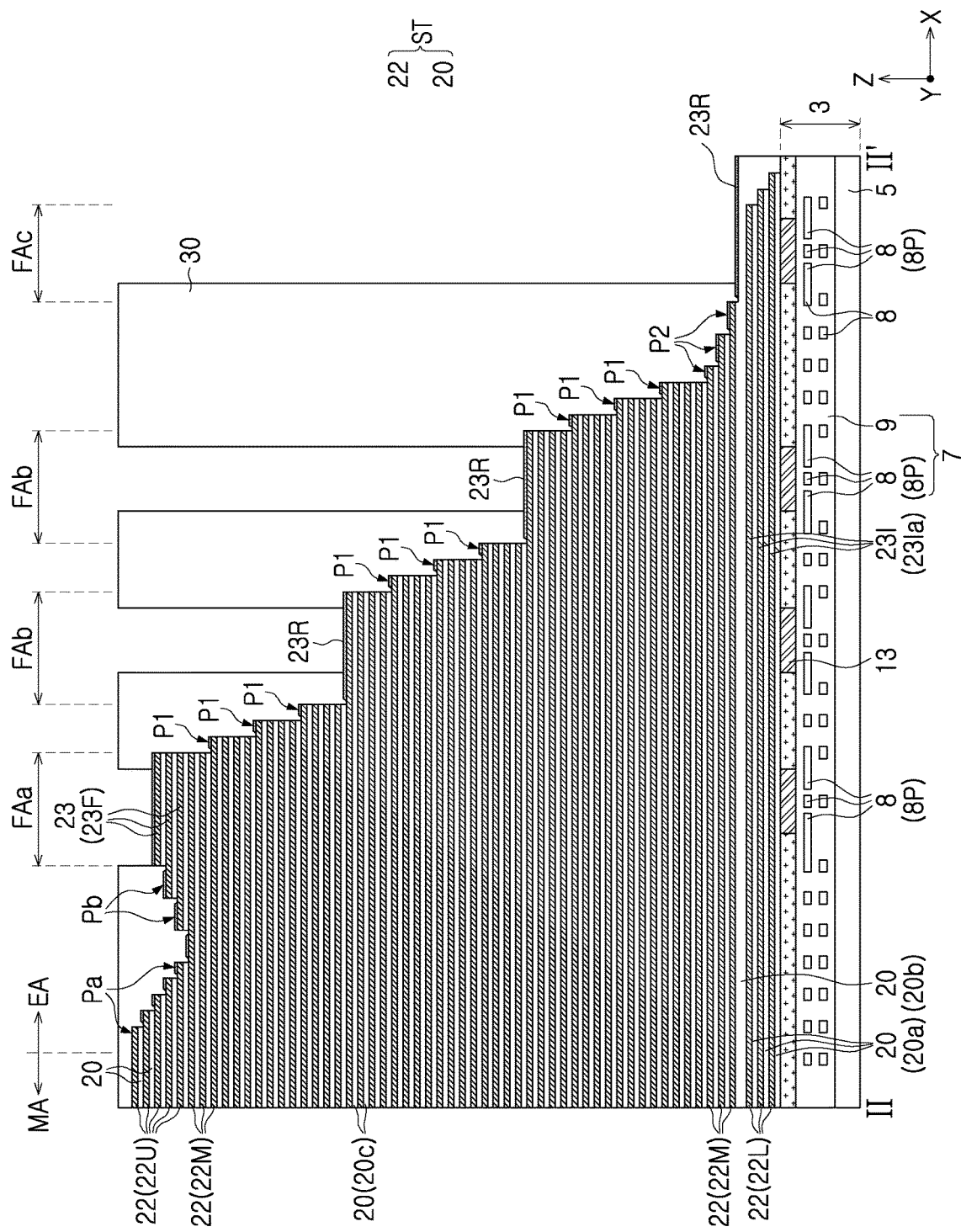
Figure 11C:
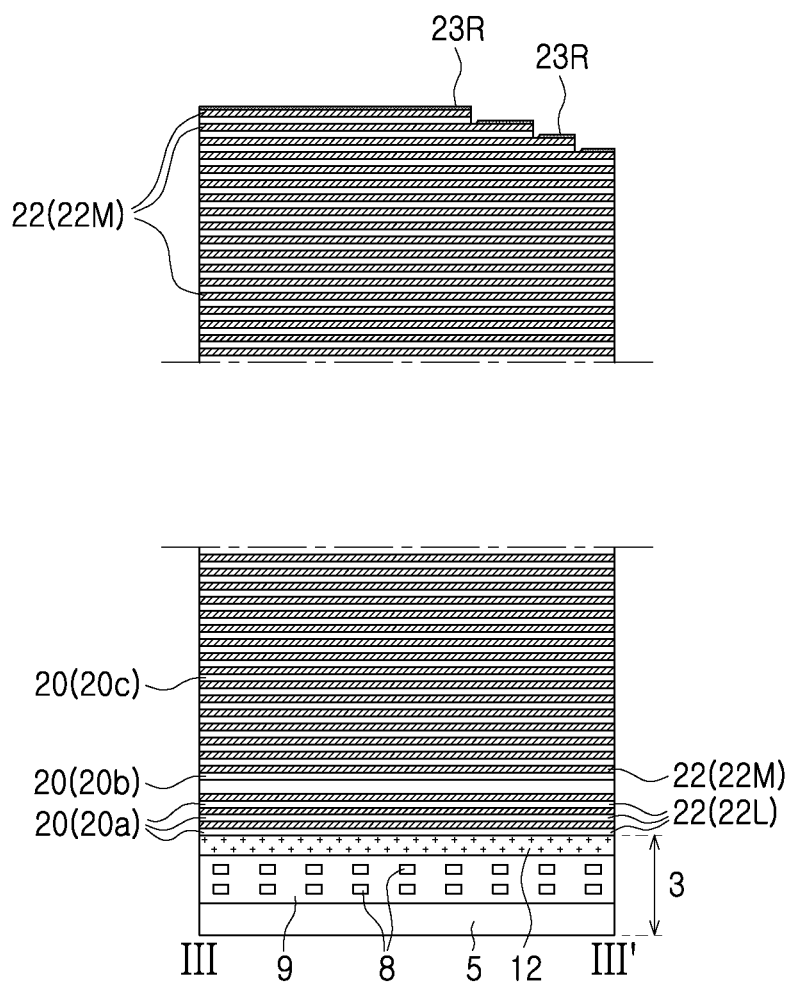
Figure 12A:
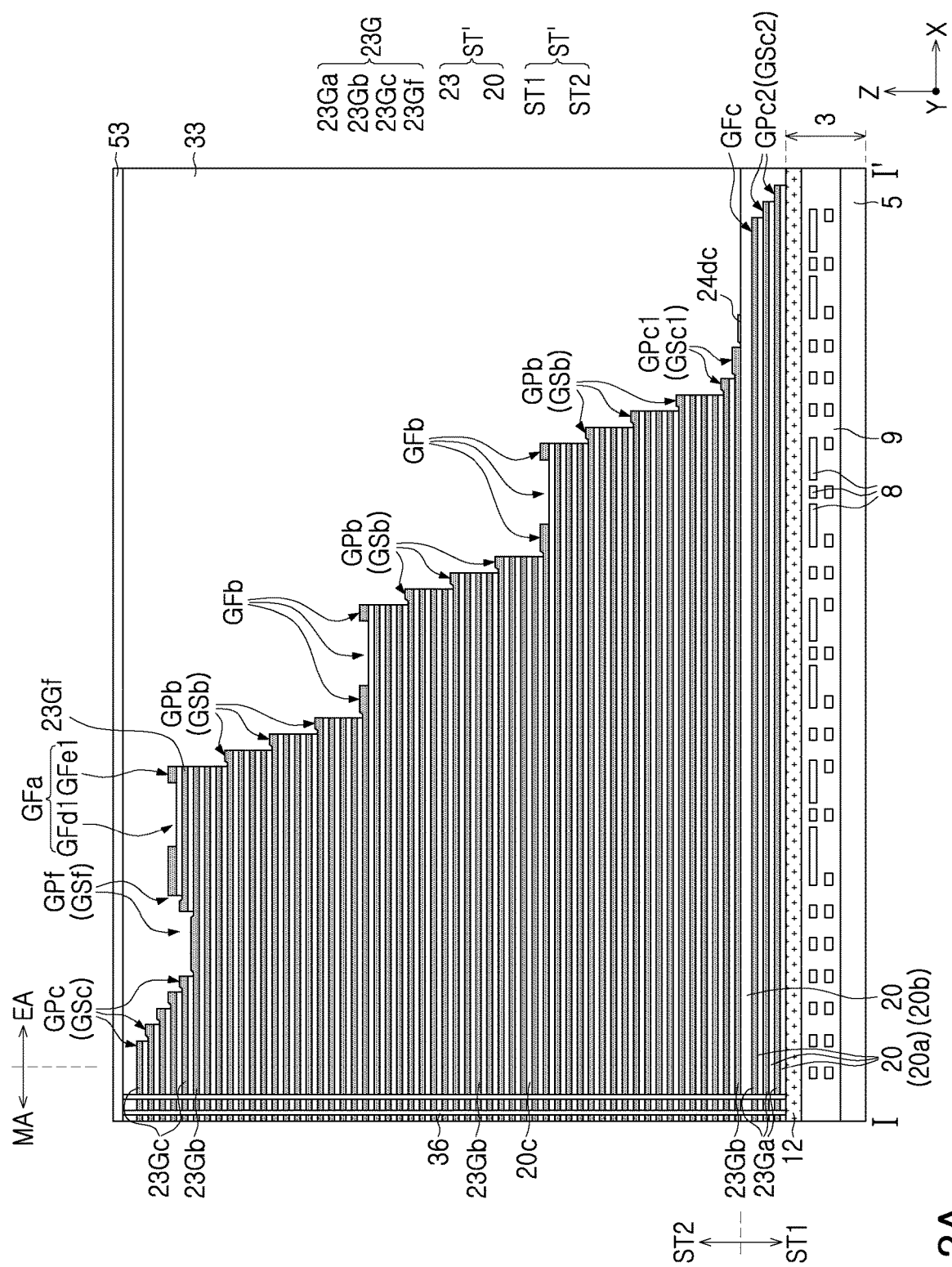
Figure 12B:
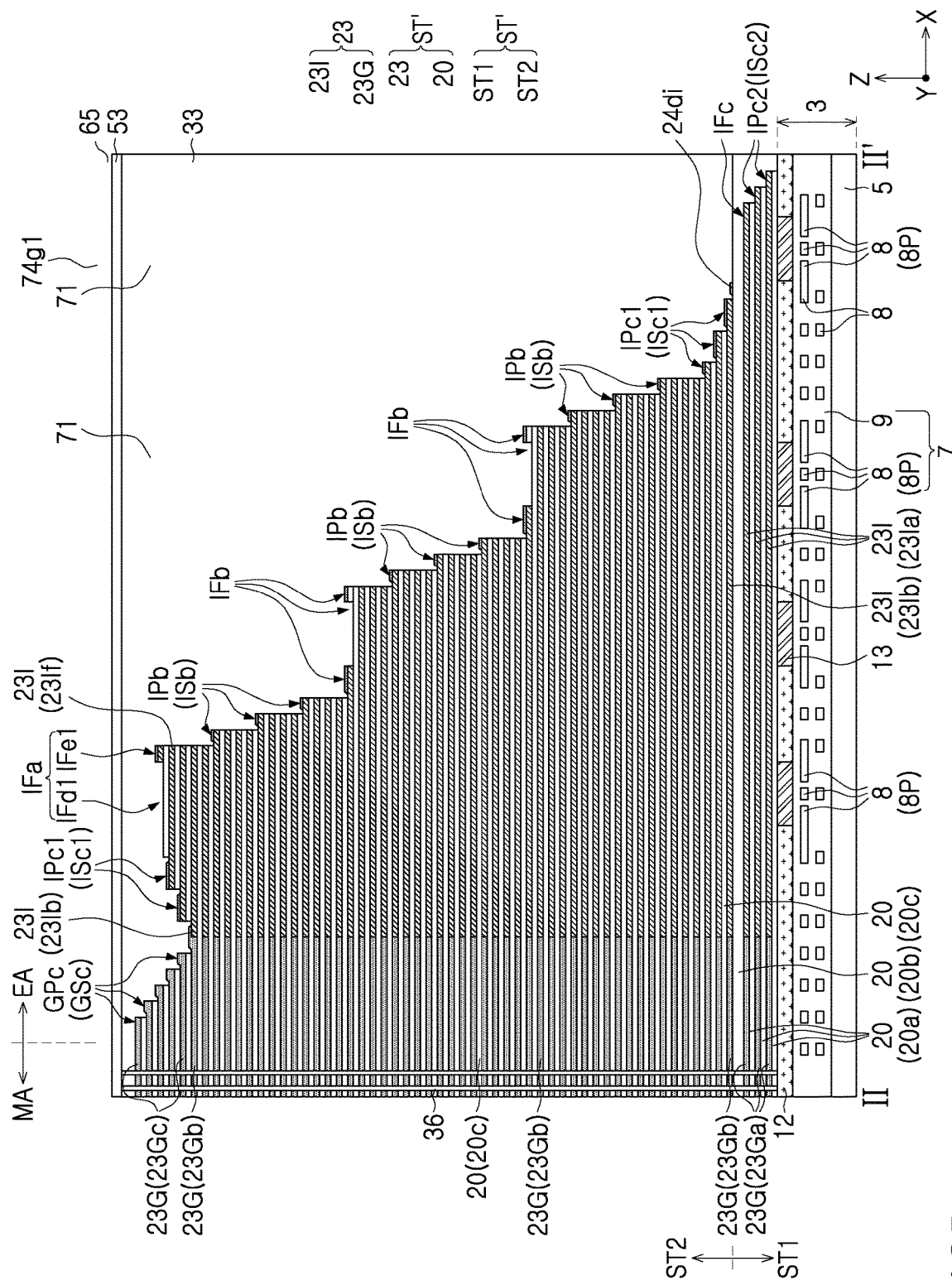
Figure 12C:
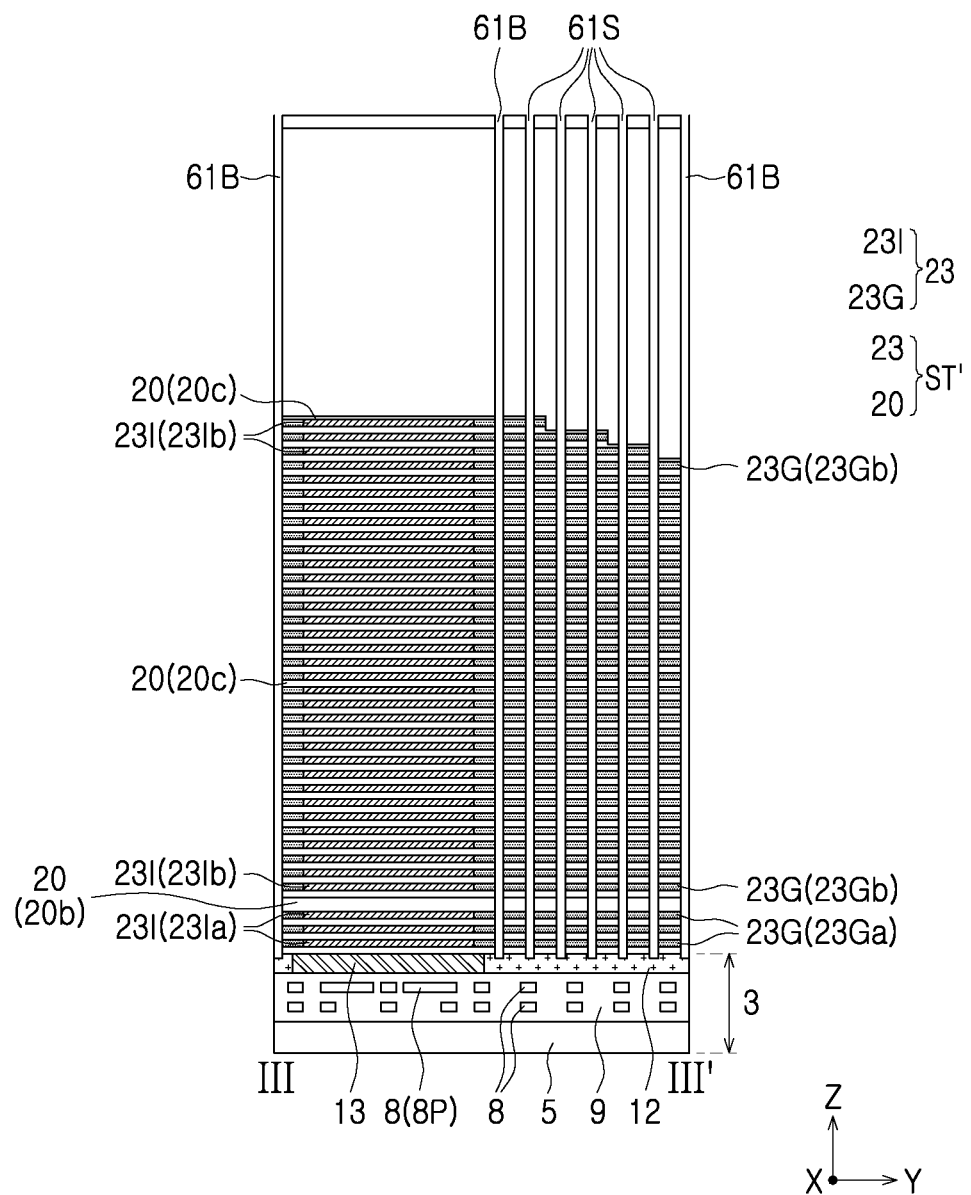

In the description below, a method of forming a semiconductor device will be described with reference to FIGS. 11A to 12C. FIGS. 11A and 12A are cross-sectional diagrams along line I-I' in FIG. 1B, FIGS. 11B and 12B are cross-sectional diagrams along line II-IF in FIG. 1B, and FIGS. 11C and 12C are cross-sectional diagrams along line in FIG. 1D.

In the description of the method of forming the semiconductor device described with reference to FIGS. 11A to 12C, the description of the structure of the semiconductor device described with reference to FIGS. 1A to 5B will not be provided, and the method of forming the semiconductor device described with reference to FIGS. 1A to 5B will be described.

Referring to FIGS. 1B, 1D, and 11A to 11C, the integrated circuit region 7 may be formed on the lower substrate 5. The lower substrate 5 may be configured as a semiconductor substrate. For example, the lower substrate 5 may be configured as single crystalline silicon substrate. The integrated circuit region 7 may include the circuit wirings 8 and the lower insulating layer 9 covering the circuit wirings 8. The circuit wirings 8 may include the peripheral contact pads 8P. The upper substrate 12 may be disposed on the integrated circuit region 7. The upper substrate 12 may be configured as a polysilicon substrate. The gap-fill insulating layer 13 penetrating through the upper substrate 12 may be disposed.

A preliminary stack structure ST may be disposed on the upper substrate 12. The preliminary stack structure ST may be disposed in the memory cell array region MA and the connection region EA on the upper substrate 12. Forming of the preliminary stack structure ST may include forming a preliminary lower stack structure ST1 on the upper substrate 12, and forming a preliminary upper stack structure ST2 on the preliminary lower stack structure ST1.

Forming the preliminary lower stack structure ST1 may include forming first interlayer insulating layers 20a and lower horizontal layers 22L alternately stacked, patterning the first interlayer insulating layers 20a and the lower horizontal layers 22L, forming lower pad regions of the lower horizontal layers 22L, and forming a second interlayer insulating layer 20b covering the lower horizontal layers 22L. The preliminary upper stack structure ST2 may be disposed on the preliminary lower stack structure ST1.

Forming the preliminary upper stack structure ST2 may include forming third interlayer insulating layers 20c and horizontal layers 22M, 22U, and 23F alternately stacked, patterning the third interlayer insulating layers 20c and the horizontal layers 22M, 22U, and 23F, forming pad regions Pa, Pb, P1, and P2 arranged in a staircase structure in the connection region EA, and forming pad capping layers 23R on the pad regions Pa, Pb, P1, and P2. The stack structure ST may be formed to include the flat regions FAa, FAb, and Fac, each having a length greater than a length of each of the pad regions Pa, Pb, P1, and P2 and configured to be planar in the first horizontal direction X.

In an example embodiment, the pad capping layers 23R may not be disposed on an uppermost horizontal layer of the horizontal layers 22M, 22U, and 23F. In another example embodiment, the pad capping layers 23R may be disposed on an uppermost horizontal layer of the horizontal layers 22M, 22U, and 23F.

A photoresist pattern 30 may be formed. The photoresist pattern 30 may have an opening for exposing a portion of each of the flat regions FAa, FAb, and FAc. The photoresist pattern 30 may expose pad regions of the lower horizontal layers 22L.

Referring to FIGS. 1B, 1D, and 12A to 12C, the pad capping layers 23R which are not covered by the photoresist pattern 30 may be etched using the photoresist pattern 30. For example, only the pad capping layers 23R may be selectively etched. In another example, while the pad capping layers 23R are etched, the preliminary horizontal layers 22 in contact with the pad capping layers 23R may be partially etched. In yet another example, while the pad capping layers 23R are etched, the preliminary horizontal layers 22 in contact with the pad capping layers 23R may be entirely etched. In still another example, while the pad capping layers 23R are etched, the preliminary horizontal layers 22 in contact with the pad capping layers 23R may be etched, and one of the interlayer insulating layers 20, exposed while the preliminary horizontal layers 22 are etched, may be etched.

The photoresist pattern 30 may be removed. The first upper insulating layer 33 may be formed on the stack structure ST.

The memory vertical structure 36 penetrating through the first upper insulating layer 33 and the stack structure ST may be formed. The memory vertical structure 36 may be formed in the memory cell array region MA. A second upper insulating layer 53 may be disposed on the first upper insulating layer 33.

Separation trenches 61B and 61C penetrating through the second upper insulating layer 53, the first upper insulating layer 33, and the stack structure ST may be formed. The separation trenches 61B and 61C may be disposed in positions corresponding to positions of the separation structures 62B, 62S1, and 62S2 illustrated in FIGS. 1A to 5B.

A portion of the preliminary horizontal layers 22 and a portion of the pad capping layers 23R may be replaced with the gate horizontal layers 23G. Accordingly, preliminary horizontal layers of the preliminary horizontal layers 22 which are not replaced with the gate horizontal layers 23G, and the pad capping layers may be defined as insulating horizontal layers 23I. Accordingly, horizontal layers including the insulating horizontal layers 23I and the gate horizontal layers 23G may be disposed.

In an example embodiment, replacing a portion of the preliminary horizontal layers 22 and a portion of the pad capping layers 23R with the gate horizontal layers 23G may include forming empty spaces by partially etching the preliminary horizontal layers 22 and the pad capping layers 23R exposed through the separation trenches 61B and 61S and filling the empty spaces with the gate horizontal layers 23G. Accordingly, the stack structure ST' including the horizontal layers 23G and 23I and the interlayer insulating layers 20, described with reference to FIGS. 1A and 5B may be formed.

In the semiconductor device in the aforementioned example embodiments, the stack structure ST' may include the plurality of interlayer insulating layers 20 and the plurality of horizontal layers 23G and 23I, and the plurality of interlayer insulating layers 20 and the plurality of horizontal layers 23G and 23I may be alternately stacked in the memory cell array region MA, and may extend into the connection region EA adjacent to the memory cell array region MA. In the connection region EA, the stack structure ST' may include a staircase region and a flat region adjacent to the staircase region. The staircase region may include pads lowering in the first horizontal direction, each of the pads may have a first length in the first horizontal direction, and the flat region may include a flat pad region having a second length greater than the first length in the first horizontal direction, a flat edge region having a third length greater than the first length in the first horizontal direction, and a flat dummy region disposed between the flat pad region and the flat edge region. A fourth length of the flat dummy region in the first horizontal direction may be greater than each of the second length and the third length.

The staircase region may be configured as the intermediate gate staircase region GSb illustrated in FIGS. 2A and 2B or the intermediate insulating staircase region ISb illustrated in FIGS. 3A and 3B, and the flat region may be configured as the intermediate gate flat region GFb illustrated in FIGS. 2A and 2B or the intermediate insulating flat region IFb illustrated in FIGS. 3A and 3B. The flat pad region may be configured as the gate flat pad region GFp2 illustrated in FIG. 2B or the insulating flat pad region IFp2 illustrated in FIG. 3B. The flat dummy region may be configured as the gate flat dummy region GFd2 illustrated in FIG. 2B or the insulating flat dummy region IFd2 illustrated in FIG. 3B. By providing the stack structure ST' including the flat regions as described above, integration density of the semiconductor device may increase.

According to the aforementioned example embodiments, by providing the stack structure including a gate region and an insulating region on the lower structure including a peripheral circuit region, integration density of the semiconductor device may improve. Also, by providing the stack structure including the flat region and the contact plugs crossing the flat region and penetrating through the stack structure on the lower structure including the peripheral circuit region, integration density of the semiconductor device may improve.

By way of summation and review, as the number of the gate electrodes stacked in a direction perpendicular to a surface of a semiconductor substrate increases, the difficulty of electrically connecting the gate electrodes to a peripheral circuit increases and unexpected defects may occur. In contrast, example embodiments provide a semiconductor device which may improve integration density.

That is, in order to implement high integration density, a semiconductor device, according to example embodiments, includes a stack structure where a portion thereof above a peripheral circuit is configured as an insulating region, such that peripheral contact plugs penetrate the insulating region of the stack structure. In this case, mold layers used for forming word lines remain in the insulating region to prevent the insulating region from decreasing while forming the word lines, a method of patterning a portion of the mole layers formed in the insulating region may be suggested.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a lower structure;
a stack structure on the lower structure, the stack structure being in a memory cell array region and extending into a connection region, and the stack structure including interlayer insulating layers and horizontal layers alternately stacked in the memory cell array region and extending into the connection region;
an upper insulating layer on the stack structure;
gate contact plugs in the connection region; and
a memory vertical structure penetrating through the stack structure in the memory cell array region,
wherein, in the connection region, a first cross-sectional structure of the stack structure includes a first gate staircase region and a first gate flat region adjacent to the first gate staircase region,
wherein the first gate staircase region includes first gate pads lowering in a first horizontal direction by a first height therebetween, the first horizontal direction being oriented from the memory cell array region toward the connection region,
wherein the first gate flat region includes a first gate flat pad region, a first gate flat edge region, and a first gate flat dummy region between the first gate flat pad region and the first gate flat edge region, topmost surfaces of the first gate flat pad region and the first gate flat edge region being at a same level, and
wherein the gate contact plugs include first gate contact plugs in contact with the first gate pads on the first gate pads, flat contact plugs in contact with the first gate flat pad region on the first gate flat pad region, and an edge flat contact plug in contact with the first gate flat edge region on the first gate flat edge region.

2. The semiconductor device as claimed in claim 1, wherein:
each of the first gate pads has a first length in the first horizontal direction,
the first gate flat pad region has a second length greater than the first length in the first horizontal direction,
the first gate flat edge region has a third length greater than the first length in the first horizontal direction,
the first gate flat dummy region has a fourth length greater than each of the second length and the third length, and
the second length is the same as or greater than the third length.

3. The semiconductor device as claimed in claim 1, wherein:
each of the first gate pads has a first length in the first horizontal direction,
the first gate flat pad region has a second length greater than the first length in the first horizontal direction,
the first gate flat edge region has a third length greater than the first length in the first horizontal direction,
the first gate flat dummy region has a fourth length greater than each of the second length and the third length, and
the fourth length is the same as or greater than a sum of the second length and the third length.

4. The semiconductor device as claimed in claim 1, wherein:
the stack structure includes a gate region and an insulating region,
the horizontal layers include horizontal gate layers in the gate region and horizontal insulating layers in the insulating region,
the first cross-sectional structure of the stack structure is through the gate region of the stack structure in the first horizontal direction, the first gate staircase region and the first gate flat region are arranged in order in the first horizontal direction, and a level of a lowermost first gate pad of the first gate pads of the first gate staircase region is different from a level of the first gate flat pad region by the first height.

5. The semiconductor device as claimed in claim 4, wherein:

each of the first gate pads has a first length in the first horizontal direction, the first gate flat pad region has a second length greater than the first length in the first horizontal direction, the first gate flat edge region has a third length greater than the first length in the first horizontal direction, the first gate flat dummy region has a fourth length greater than each of the second length and the third length, a second cross-sectional structure through the insulating region of the stack structure in the first horizontal direction includes a first insulating staircase region, and a first insulating flat region adjacent to the first insulating staircase region, the first insulating staircase region includes first insulating pads lowering in the first horizontal direction by the first height therebetween, each of the first insulating pads has the first length in the first horizontal direction, and the first insulating flat region includes a first insulating flat pad region having the second length, a first insulating flat edge region having the third length, and a first insulating flat dummy region having the fourth length between the first insulating flat pad region and the first insulating flat edge region.

6. The semiconductor device as claimed in claim 5, further comprising peripheral contact plugs, wherein the lower structure includes a lower substrate, an integrated circuit region on the lower substrate, an upper substrate on the integrated circuit region, and a gap-fill insulating layer penetrating through the upper substrate, wherein the peripheral contact plugs penetrate through the upper insulating layer, the stack structure, and the gap-fill insulating layer and are electrically connected to peripheral contact pads of the integrated circuit region, and wherein the peripheral contact plugs penetrate through the first insulating flat dummy region.

7. The semiconductor device as claimed in claim 5, wherein:

the first insulating flat pad region and the first insulating flat edge region are at a same level, each of the first insulating flat pad region and the first insulating flat edge region includes a first insulating material layer and a second insulating material layer on the first insulating material layer, the second insulating material layer in the first insulating flat pad region and the second insulating material layer in the first insulating flat edge region are spaced apart from each other in the first horizontal direction, each of the horizontal insulating layers includes the first insulating material layer, and a maximum thickness of each of the first insulating flat pad region and the first insulating flat edge region is greater than a thickness of each of the horizontal layers in the memory cell array region.

8. The semiconductor device as claimed in claim 7, wherein the first insulating flat dummy region includes an insulating material different from the first and second insulating material layers.

9. The semiconductor device as claimed in claim 5, wherein:

the first insulating flat pad region and the first insulating flat edge region are at a same level, each of the first insulating flat pad region and the first insulating flat edge region includes a first insulating material layer and a second insulating material layer on the first insulating material layer, the first insulating material layer in the first insulating flat pad region and the first insulating material layer in the first insulating flat edge region extend into the first insulating flat dummy region, and a minimum thickness of the first insulating material layer extending from the first insulating flat pad region and the first insulating flat edge region into the first insulating flat dummy region is smaller than a maximum thickness of the first insulating material layer in the first insulating flat pad region.

10. The semiconductor device as claimed in claim 4, wherein:

the first cross-sectional structure of the stack structure further includes a second gate flat region adjacent to the first gate staircase region, the second gate flat region, the first gate staircase region, and the first gate flat region are arranged sequentially in the first horizontal direction, the second gate flat region includes a second gate flat dummy region and a second gate flat edge region adjacent to the second gate flat dummy region, the second gate flat edge region has a same cross-sectional structure as a cross-sectional structure of the first gate flat edge region, the second gate flat dummy region has a same cross-sectional structure as a cross-sectional structure of the first gate flat dummy region, and a length of the second gate flat dummy region in the first horizontal direction is greater than a length of the first gate flat dummy region in the first horizontal direction.

11. The semiconductor device as claimed in claim 10, wherein:

the stack structure includes a lower stack structure, a first upper stack structure on the lower stack structure, and a second upper stack structure on the first upper stack structure, and each of the first and second upper stack structures includes the first gate flat region and the second gate flat region.

12. The semiconductor device as claimed in claim 1, wherein:

the first gate flat pad region includes a first conductive layer, the first gate flat edge region includes a second conductive layer, the first gate flat dummy region includes an insulating material, and the insulating material of the first gate flat dummy region separates the first conductive layer of the first gate flat pad region from the second conductive layer of the first gate flat edge region in the first horizontal direction such that the first conductive layer and the second conductive layer are spaced apart from each other in the first horizontal direction.

13. The semiconductor device as claimed in claim 1, wherein a maximum thickness of each of the first gate flat pad region and the first gate flat edge region is greater than a thickness of each of the horizontal layers in the memory cell array region.

14. The semiconductor device as claimed in claim 1, wherein:
the first gate flat pad region includes a first conductive layer,
the first gate flat edge region includes a second conductive layer,
the first gate flat dummy region includes a third conductive layer extending from the first conducive layer and the second conductive layer, and
a maximum thickness of each of the first and second conductive layers is greater than a minimum thickness of the third conductive layer.

15. The semiconductor device as claimed in claim 1, wherein:
in the connection region, the first cross-sectional structure of the stack structure further includes an upper staircase region, a second gate staircase region, a lower gate flat region, and a lower staircase region,
the upper staircase region, the first gate staircase region, the first gate flat region, the second gate staircase region, the lower gate flat region, and the lower staircase region are arranged sequentially in the first horizontal direction,
the upper staircase region includes upper pads,
the lower staircase region includes lower pads,
the second gate staircase region includes second gate pads,
the upper pads are lowered in the first horizontal direction by a second height therebetween, the second height being smaller than the first height,
the lower pads are lowered in the first horizontal direction by the second height therebetween,
the second gate pads are lowered in the first horizontal direction by the first height therebetween,
the first gate pads and the second gate pads are lowered in a second horizontal direction perpendicular to the first horizontal direction by the second height therebetween, the second height smaller than the first height, and
a length of the lower gate flat region in the first horizontal direction is greater than a length of each of the first gate pads in the first horizontal direction.

16. A semiconductor device, comprising:
a lower structure;
a stack structure in a memory cell array region on the lower structure and extending from the memory cell array region into a connection region;
gate contact plugs on the stack structure in the connection region; and
a memory vertical structure penetrating through the stack structure in the memory cell array region,
wherein the stack structure includes interlayer insulating layers and horizontal layers alternately stacked,
wherein, in the connection region, the stack structure includes a staircase region and a flat region adjacent to the staircase region,
wherein the staircase region includes pads lowered in a first horizontal direction,
wherein the flat region includes a flat pad region, a flat edge region, and a flat dummy region between the flat pad region and the flat edge region, topmost surfaces of the flat pad region and the flat edge region being at a same level, and
wherein the gate contact plugs include first gate contact plugs on the pads, flat contact plugs on the flat pad region, and a flat edge contact plug on the flat edge region.

17. The semiconductor device as claimed in claim 16, wherein;
each of the pads has a first length in the first horizontal direction,
the flat pad region has a second length greater than the first length in the first horizontal direction;
the flat edge region has a third length greater than the first length in the first horizontal direction, and
the flat dummy region has a fourth length greater than each of the second length and the third length in the first horizontal direction, and
each of the flat pad region, the flat edge region, and the pads has a maximum thickness greater than a thickness of each of the horizontal layers in the memory cell array region.

18. The semiconductor device as claimed in claim 16, further comprising peripheral contact plugs penetrating through the stack structure in the connection region,
wherein the stack structure further includes a gate region and an insulating region adjacent to each other,
wherein the gate contact plugs are on the gate region of the stack structure,
wherein the lower structure includes peripheral contact pads, and
wherein the peripheral contact plugs penetrate through the insulating region of the stack structure, extend into the stack structure, and are in contact with the peripheral contact pads.

19. A semiconductor device, comprising:
a lower structure;
a stack structure in a memory cell array region on the lower structure and extending from the memory cell array region into a connection region;
gate contact plugs on the stack structure; and
a memory vertical structure penetrating through the stack structure in the memory cell array region,
wherein the stack structure includes a lower stack structure and an upper stack structure on the lower stack structure,
wherein the lower stack structure includes lower horizontal layers stacked and spaced apart from each other in a vertical direction,
wherein the vertical direction is perpendicular to an upper surface of the lower structure,
wherein the upper stack structure includes upper horizontal layers stacked and spaced apart from each other in the vertical direction,
wherein the upper horizontal layers include a first staircase region including first pads lowered in the connection region by a first height therebetween,
wherein the lower horizontal layers include a second staircase region including second pads lowered by a second height smaller than the first height,
wherein the upper stack structure includes a first flat region adjacent to the first staircase region,
wherein the lower stack structure includes a second flat region adjacent to the second staircase region,
wherein each of the first pads has a first length,
wherein the first flat region includes a flat pad region having a second length greater than the first length in a first horizontal direction, a flat edge region having a third length greater than the first length in the first horizontal direction, and a flat dummy region between the flat pad region and the flat edge region, wherein a fourth length of the flat dummy region in the first horizontal direction is greater than each of the second length and the third length, wherein the second flat region has a length greater than the first length in the first horizontal direction, and wherein the gate contact plugs include first gate contact plugs on first and second pads, a second gate contact plug and a dummy contact plug spaced apart from each other on the flat pad region, and a flat edge contact plug on the flat edge region.

20. The semiconductor device as claimed in claim 19, further comprising peripheral contact plugs penetrating through the stack structure in the connection region, wherein the stack structure includes a gate region and an insulating region, wherein the gate contact plugs are on the gate region of the stack structure, wherein the peripheral contact plugs penetrate through the insulating region of the stack structure, wherein the lower structure includes peripheral contact pads, wherein a portion of the peripheral contact plugs passes through the flat dummy region in the insulating region of the stack structure, extends into the lower structure, and is in contact with a portion of the peripheral contact pads, wherein another portion of the peripheral contact plugs passes through the second flat region in the insulating region of the stack structure, penetrates through the stack structure, extends into the lower structure, and is in contact with another portion of the peripheral contact pads, and wherein a length of the first flat region in the first horizontal direction is greater than a length of the second flat region in the first horizontal direction.

* * * * *